United States Patent
Wang et al.

(10) Patent No.: US 9,722,070 B2
(45) Date of Patent: *Aug. 1, 2017

(54) METHODS OF MANUFACTURING TRENCH SEMICONDUCTOR DEVICES WITH EDGE TERMINATION STRUCTURES

(71) Applicant: Freescale Semiconductor, Inc., Austin, TX (US)

(72) Inventors: Peilin Wang, Beijing (CN); Jingjing Chen, Beijing (CN); Edouard de Frésart, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/167,925

(22) Filed: May 27, 2016

(65) Prior Publication Data

US 2016/0276475 A1    Sep. 22, 2016

Related U.S. Application Data

(62) Division of application No. 13/612,231, filed on Sep. 12, 2012, now Pat. No. 9,368,576.

(30) Foreign Application Priority Data

May 17, 2012  (CN) .......................... 2012 1 0291502

(51) Int. Cl.
*H01L 29/78*   (2006.01)
*H01L 29/66*   (2006.01)
(Continued)

(52) U.S. Cl.
CPC ........ *H01L 29/7811* (2013.01); *H01L 29/063* (2013.01); *H01L 29/0696* (2013.01);
(Continued)

(58) Field of Classification Search
None
See application file for complete search history.

(56) References Cited

U.S. PATENT DOCUMENTS 5,614,751 A   3/1997   Yilmaz et al.
6,861,701 B2  3/2005   Williams et al.
(Continued)

FOREIGN PATENT DOCUMENTS

| CN | 101371343 A | 2/2009 |
|---|---|---|
| CN | 102074581 A | 5/2011 |
| CN | 102246306 A | 11/2011 |

OTHER PUBLICATIONS

Chinese Office Action for Patent Appln. No. CN201210291502.5 (Feb. 3, 2017).

*Primary Examiner* — Whitney T Moore
(74) *Attorney, Agent, or Firm* — Sherry W. Schumm

(57) ABSTRACT

Embodiments of semiconductor devices and methods of their formation include providing a semiconductor substrate having a top surface, a bottom surface, an active region, and an edge region, and forming a gate structure in a first trench in the active region of the semiconductor substrate. A termination structure is formed in a second trench in the edge region of the semiconductor substrate. The termination structure has an active region facing side and a device perimeter facing side. The method further includes forming first and second source regions of the first conductivity type are formed in the semiconductor substrate adjacent both sides of the gate structure. A third source region is formed in the semiconductor substrate adjacent the active region facing side of the termination structure. The semiconductor device may be a trench metal oxide semiconductor device, for example.

21 Claims, 12 Drawing Sheets

(51) Int. Cl.
  *H01L 29/06* (2006.01)
  *H01L 29/40* (2006.01)
  *H01L 29/10* (2006.01)
  *H01L 29/08* (2006.01)
  *H01L 29/423* (2006.01)

(52) U.S. Cl.
  CPC ...... *H01L 29/0865* (2013.01); *H01L 29/1083* (2013.01); *H01L 29/1095* (2013.01); *H01L 29/407* (2013.01); *H01L 29/4238* (2013.01); *H01L 29/42372* (2013.01); *H01L 29/66734* (2013.01); *H01L 29/7813* (2013.01); *H01L 29/0869* (2013.01); *H01L 29/4236* (2013.01)

(56) References Cited

U.S. PATENT DOCUMENTS

| | | |
|---|---|---|
| 6,921,699 B2 | 7/2005 | Ma et al. |
| 6,936,893 B2 | 8/2005 | Tanaka et al. |
| 7,045,859 B2 | 5/2006 | Amali et al. |
| 7,052,963 B2 | 5/2006 | Williams et al. |
| 7,154,177 B2 | 12/2006 | Van Dalen et al. |
| 7,196,397 B2 | 3/2007 | Chiola et al. |
| 7,361,555 B2 | 4/2008 | Koops et al. |
| 7,452,777 B2 | 11/2008 | Kocon et al. |
| 7,466,005 B2 | 12/2008 | Chiola |
| 7,504,306 B2 | 3/2009 | Sapp et al. |
| 7,579,650 B2 | 8/2009 | Cao et al. |
| 7,772,642 B2 | 8/2010 | Marchant |
| 8,174,067 B2 | 5/2012 | Yedinak et al. |
| 8,786,046 B2 | 7/2014 | Tamaki et al. |
| 9,293,526 B2 | 3/2016 | Yedinak et al. |
| 2007/0173021 A1 | 7/2007 | Kocon et al. |
| 2008/0135931 A1 | 6/2008 | Challa et al. |
| 2008/0227269 A1 | 9/2008 | Ma |
| 2010/0155879 A1 | 6/2010 | Schulze et al. |
| 2010/0163972 A1 | 7/2010 | Saggio et al. |
| 2011/0095360 A1 | 4/2011 | Krumrey et al. |
| 2012/0100163 A1 | 4/2012 | Brimnes et al. |

METHODS OF MANUFACTURING TRENCH SEMICONDUCTOR DEVICES WITH EDGE TERMINATION STRUCTURES

RELATED APPLICATION

This application is a divisional of co-pending U.S. patent application Ser. No. 13/612,231, filed on Sep. 12, 2012.

TECHNICAL FIELD

Embodiments generally relate to semiconductor devices, and more particularly relate to trench power devices incorporating edge termination structures.

BACKGROUND

Semiconductor devices employing trench structures are well known in the art. FIG. 1 is a simplified schematic cross-sectional view of prior art N-channel trench metal oxide semiconductor device 100 employing a trench structure for the control gate. Device 100 comprises N+ substrate 110, of for example single crystal silicon, which acts as the drain of device 100 and on which is provided drain contact 112 and drain connection 114. N layer 120 is formed on substrate 110, usually by epitaxy. In an active region 170 of device 100, P-body regions 130 are provided extending from surface 132 into N layer 120. N+ source regions 134 are provided extending from surface 132 into P-body regions 130.

A gate structure is formed in a trench, which extends into device 100 from surface 132 through P-body region 130 and into N layer 120. The trench is generally centered between source regions 134. Portion 122 of N layer 120 beneath the gate structure acts as the drift space of device 100. Gate oxide 152 is formed on the exposed interior surface of the trench, and a conductive gate electrode 154 is provided substantially filling the trench. Contacts 136 are provided on source regions 134 (and portions of P-body regions 130), and the contacts 136 are coupled to source connection 138. Contact 156 is provided on gate electrode 154 and coupled to gate connection 158. When appropriate bias is applied, source-drain current 160 flows from source regions 134 through N-channel regions 140 in P-body regions 130 and through N drift space portion 122 of layer 120 to substrate 110 which, as indicated above, acts as the drain of device 100.

In an edge region 180 of device 100, a P-edge region 182 is provided in order to avoid breakdown in the edge region 180. The P-edge region 182 extends from surface 132 into N layer 120 to a depth that is greater than the depth of the P-body regions 130. During manufacture of device 100, the P-edge region 182 is formed using conventional masking and implant processes, which are distinct from the masking and implant processes used to produce the P-body regions 130.

Although the P-edge region 182 is generally sufficient to avoid breakdown in the edge region 180, the inclusion of P-edge region 182 may have several disadvantages. For example, distinct masking and implantation steps are used to form the P-edge region 182, and the mask used during formation of the P-edge region 182 may cause semiconductor surface roughness. In addition, the P-edge implant may cause latent damage and weakness in the semiconductor, thus potentially resulting in defects that may increase the occurrence of substantial gate-to-source leakage current (e.g., IGSS failures) in the edge region 180 of the device 100. In addition, P-edge regions (not shown) in adjacent terminations may cause parasitic device (PMOS) and potential source-to-source leakage. Further, formation of the P-edge region 182 may add approximately 10 to 15 percent of extra cost to the fabrication process for device 100.

Accordingly, there is an ongoing need for improved device structures, materials and methods of fabrication that can overcome these difficulties and provide improved performance. It is further desirable that the methods, materials, and structures employed be compatible with present day manufacturing capabilities and materials and not require substantial modifications to available manufacturing procedures or substantial increases in manufacturing costs. Furthermore, other desirable features and characteristics of the various embodiments will become apparent from the subsequent detailed description and the appended claims, taken in conjunction with the accompanying drawings and the foregoing technical field and background.

BRIEF DESCRIPTION OF THE DRAWINGS

Embodiments will hereinafter be described in conjunction with the following drawing figures, wherein like numerals denote like elements.

DETAILED DESCRIPTION

Figure 1:
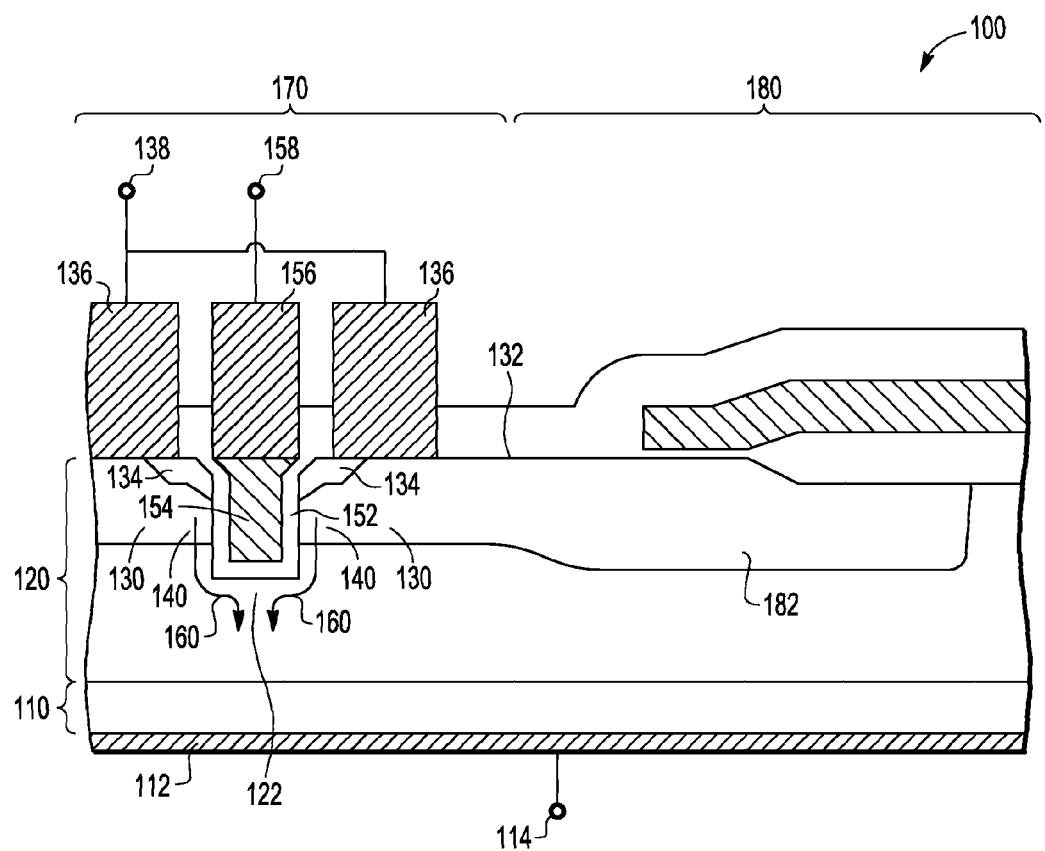
FIG. 1 is a simplified schematic cross-sectional view of a conventional N-channel trench metal oxide semiconductor device employing a trench structure for the control gate.

The following detailed description is merely exemplary in nature and is not intended to limit the embodiments or the application and uses of the various embodiments. Furthermore, there is no intention to be bound by any expressed or implied theory presented in the preceding technical field or background, or the following detailed description.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order.

It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

For convenience of explanation and not intended to be limiting, embodiments are described for semiconductor devices formed using silicon (Si) as an exemplary semiconductor material, but the embodiments are not limited merely to these materials. The principles taught herein apply to a wide variety of semiconductor materials of different lattice constants and/or band gaps that can be combined to improve the performance and/or reliability of the devices. Non-limiting examples of other suitable semiconductor material combinations are SiGe, GaN and Si, SiGe and GaAs, GaAs and Ge, Si and $Si_{1-y}C_y$, SiC and AlN, SiC and BP, InGaN and GaN, and various other type IV, III-V and II-VI compounds and mixtures thereof and organic semiconductors. Accordingly, while Si is identified as a suitable semiconductor material to obtain the improved properties described herein, the embodiments are not limited thereto.

For convenience of explanation, FIGS. 2-20 illustrate N-channel devices but this is merely by way of example and not intended to be limiting. Persons of skill in the art will understand that by interchanging the various dopant types, P-channel devices can also be made according to further embodiments. In addition, although embodiments of a trench-type, Metal Oxide Semiconductor Field Effect Transistor (MOSFET) is described in detail herein, other types of devices can also be fabricated using the principals taught herein (e.g., Insulated Gate Bipolar Transistor (IGBT) devices, other types of bipolar transistors, junction diodes, power rectifiers, thyristors, and other devices).

Figure 2:
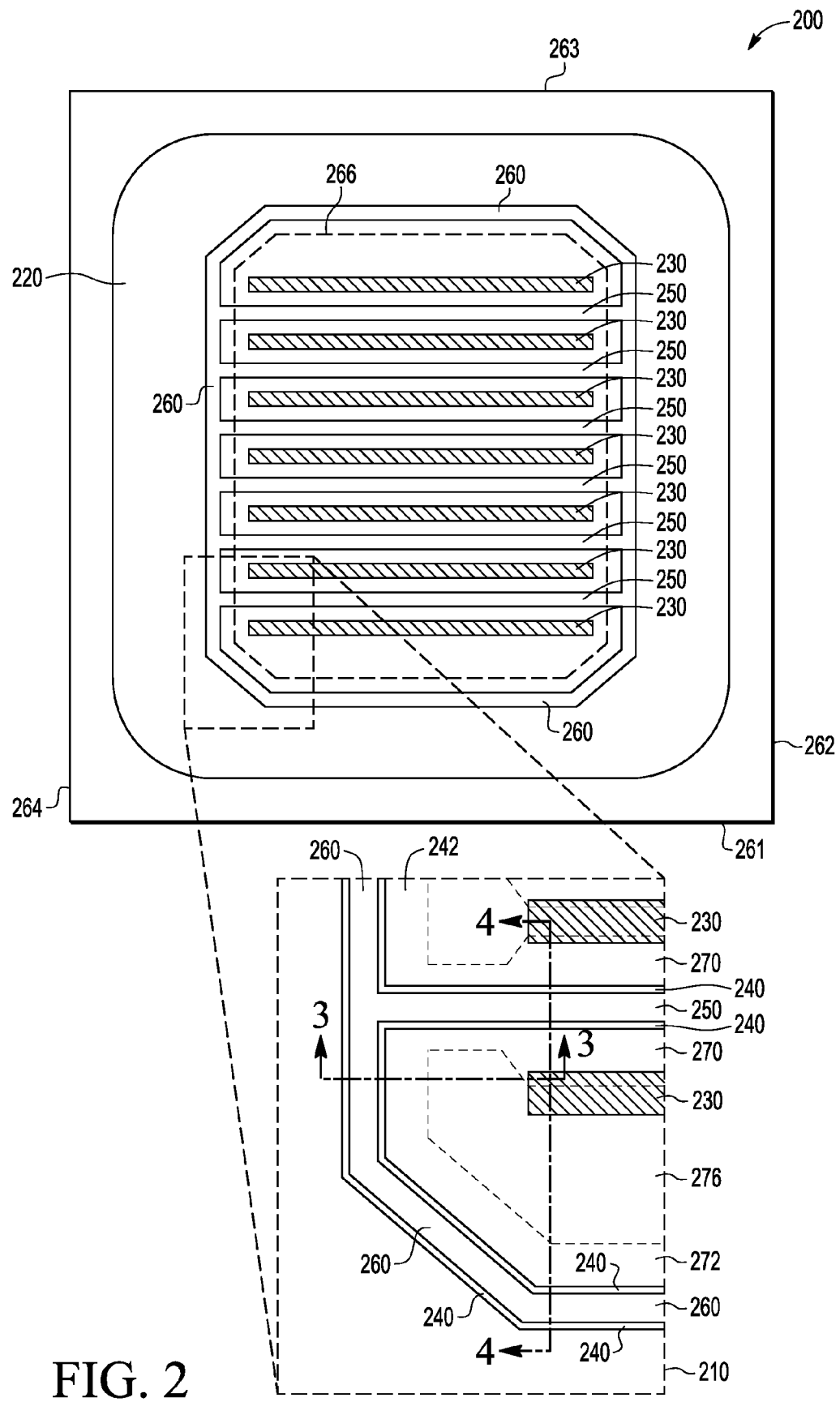
FIG. 2 is a simplified top-view of a trench metal oxide semiconductor device according to an embodiment.

FIG. 2 is a simplified top-view of a trench metal oxide semiconductor device 200 employing a trench structure for the control gate, according to an embodiment. The lower-left portion 210 of the semiconductor device 200 shown in greater detail. FIG. 2 is intended primarily to depict an example layout of various gate structures and edge termination structures of device 200. As will be explained in more detail below, the gate structures each include a gate electrode 250, and the edge termination structures each include an edge electrode 260. Each of the gate electrodes 250 and edge electrodes 260 are formed within a trench in a semiconductor substrate 220. Accordingly, each of the gate electrodes 250 and edge electrodes 260 has a shape that substantially conforms to the shape of the trench within which it is formed.

FIG. 2 intentionally excludes certain portions of device 200 that would obstruct a depiction of the gate electrodes 250 and edge electrodes 260 (e.g., various layers that may overly the gate electrodes 250 and electrodes 260, for example). Such additional portions are illustrated and described in conjunction with FIGS. 3-18, later. FIG. 2 also depicts an example layout of source contacts 230 disposed between the gate electrodes 250 and edge electrodes 260. Although a particular layout of gate electrodes 250, edge electrodes 260, and source contacts 230 is depicted in FIG. 2, it is to be understood that embodiments may be used in semiconductor structures having layouts, as well (e.g., different numbers or arrangements of contacts and/or gates and/or edge structures, differently shaped or oriented contacts and/or gates and/or edge structures, and so on).

According to an embodiment, the trench-shaped gate electrodes 250 are formed in an active region of the device 200 (e.g., a generally central portion of the device 200), and the gate electrodes 250 function as the control gates for the device 200. In contrast, the trench-shaped edge electrodes 260 are proximate edge regions of the device 200 (e.g., portions of the device 200 between the active region of the device 200 and sides 261, 262, 263, 264 of the device 200). According to an embodiment, the edge electrodes 260 are inset from the device perimeter (e.g., the perimeter defined by sides 261-264) and/or in proximity to a die edge. Edge electrodes 260 also may be configured to function as control gates for the device 200, although the edge electrodes 260 are configured differently from the gate electrodes 250, as will be explained in more detail later.

As used herein, the term "active gate structure" refers to a structure within an active region of a device that includes a gate electrode formed within a trench, including a gate oxide between the gate electrode and the substrate within which the trench is formed. In contrast, the term "edge termination structure" refers to a structure within an edge region of a device that includes an edge electrode formed within a trench, including a gate oxide between the edge electrode and the substrate within which the trench is formed. According to various embodiments, edge termination structures are provided in order to avoid breakdown in the edge region. An edge termination structure alternatively may be defined as a structure, including an edge electrode 260, that is located between a side 261-264 of the semiconductor device 200 and any active gate structure of the device 200. In other words, no active gate structures are located between an edge termination structure and a side 261-264 of the semiconductor device 200 that is closest to the edge termination structure. Alternatively still, an edge termination structure may be defined as a structure, including an edge electrode 260, that is formed in a termination region (or an edge region or perimeter region) of the device 200. According to an embodiment, each edge electrode 260 is inset from a corresponding side 261-264 of device 200 by a distance in a range of about 2 micrometers to about 10 micrometers (e.g., about 4 micrometers), although the edge electrodes 260 may be inset from corresponding sides 261-264 by larger or smaller distances, as well.

As can be seen in FIG. 2, edge electrodes 260 may include trench-shaped structures having principal axes that extend in a direction parallel to the principal axes of the trench-shaped gate electrodes 250, and edge electrodes 260 also include trench-shaped structures having principal axes that extend in a direction perpendicular to the principal axes of gate electrodes 250. The latter edge electrodes 260 may intersect the gate electrodes 250 at both ends of the gate electrodes 250, as shown in FIG. 2. In addition, the edge electrodes 260 may include trench-shaped structures that couple the parallel and perpendicular edge electrodes 260 at the corners of device 200 (e.g., the diagonally-extending, connecting edge termination structure shown in the detailed callout of the lower-left portion 210 of device 200). Alternatively, the parallel and perpendicular edge electrodes 260 may be directly coupled (e.g., at right angles) at the corners of the device 200. In the illustrated embodiment, the combination of parallel and perpendicular edge electrodes 260 (and the diagonally-arranged connecting edge termination structures) forms a trench-shaped, edge termination structure that substantially surrounds (e.g., completely surrounds or surrounds with one or more gaps in the edge termination structure formed by the edge electrodes 260) and encompasses the gate electrodes 250. In alternate embodiments, embodiments of edge termination structures may not substantially surround or encompass the gate electrodes 250 (e.g., one or more of the parallel, perpendicular, and/or diagonal edge electrodes 260 may be excluded.

According to an embodiment, the material (e.g., polycrystalline silicon) forming gate electrodes 250 and edge electrodes 260 is integrally connected, as shown in FIG. 2. This enables all of the gate electrodes 250 and edge electrodes 260 (and the trenches within which they are formed) to be produced using the same fabrication steps, and this further enables voltages to be applied to all of the gate electrodes 250 and edge electrodes 260 simultaneously using one or more common gate contacts (not shown in FIG. 2). In alternate embodiments, the gate electrodes 250 and edge electrodes 260 may not be connected in the manner shown in FIG. 2 (e.g., semiconductor material may be present to physically and electrically isolate gate electrodes 250 from edge electrodes 260). In such embodiments, distinct gate contacts may be coupled to the gate and edge electrodes 250, 260. In addition, although a particular number of gate electrodes 250 and edge electrodes 260 are shown, a device may include more or fewer gate electrodes 250 and/or edge electrodes 260.

Figure 3:
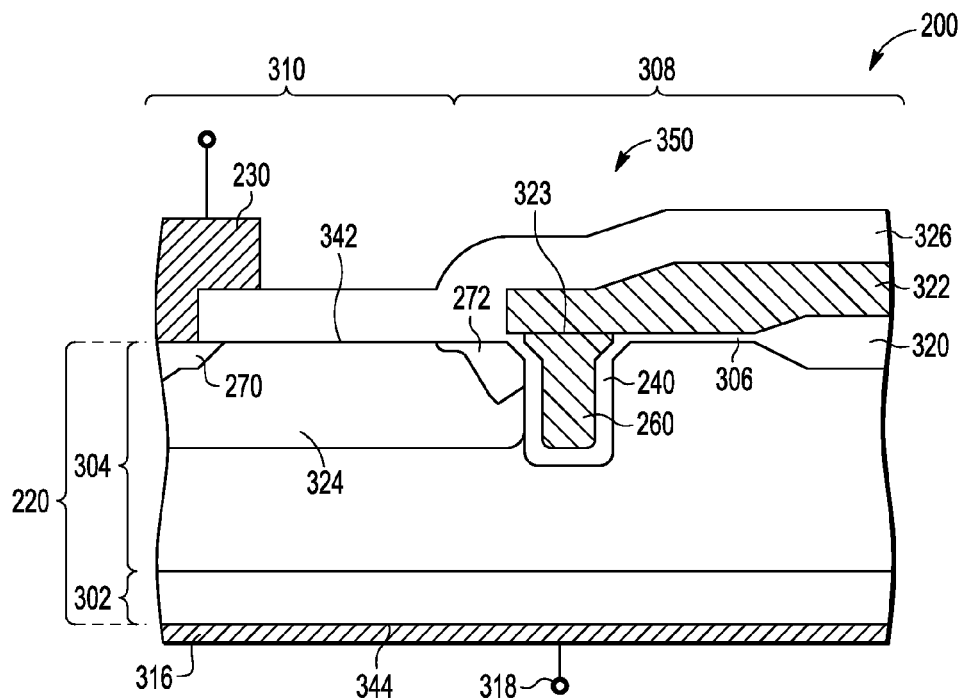
FIG. 3 is a simplified cross-sectional view of the trench metal oxide semiconductor device of FIG. 2 along a first axis according to an embodiment.

According to an embodiment, electrical contact to the gate and edge electrodes 250, 260 is made through a conductive gate feed structure (e.g., also of polycrystalline silicon) partially overlying the top surface of the substrate 220 of the device 200 and in electrical contact with some or all portions of at least the edge electrodes 260 (e.g., conductive gate feed structure 322, FIG. 3). According to an embodiment, the gate feed structure overlies edge electrodes 260 and extends to the perimeter of device 200, leaving an opening in the gate feed structure over substantially the entire active region (e.g., the central region) of device 200. For example, dashed box 266 depicts an example of an inner extent of the gate feed structure, indicating that the gate feed structure overlies the edge electrodes 260 on all sides of the edge termination structure, and only minimally overlies the ends of gate electrodes 250 (e.g., where gate electrodes 250 intersect the perpendicular edge electrodes 260). In alternate embodiments, the gate feed structure may overly the edge electrodes 260 on fewer than all sides of the edge termination structure (e.g., the gate feed structure may only overly the edge electrodes 260 on some but not all of the right side, left side, top, and/or bottom of the edge termination structure). Either way, the gate feed structure provides electrical connectivity to the gate and edge electrodes 250, 260. One or more gate contacts (not shown in FIG. 2) may connect to any of various portions of the gate feed structure, the gate electrodes 250, and/or the edge electrodes 260. According to an embodiment, one or more gate contacts connect to one or more portions of the gate feed structure. The gate contact(s) may connect to one or more portions of the gate feed structure indicated in FIG. 2. Alternatively, the gate feed structure may extend to portions of the substrate that are beyond the sides 261-264 of the device 200. Accordingly, gate contact(s) may be located in areas that are beyond the sides 261-264 of the device 200 shown in FIG. 2.

According to an embodiment, a gate oxide 240 is present between gate electrodes 250 and edge electrodes 260 and the semiconductor substrate 220 within which the gate electrodes 250 and edge electrodes 260 are formed. More particularly, the gate oxide 240 lines trenches in the semiconductor substrate 220 within which the gate electrodes 250 and edge electrodes 260 are formed. In addition, source regions 270, 272 of a first conductivity type (e.g., N type or P type) are present in the semiconductor substrate 220 adjacent the gate oxide 240 at a top surface (shown in FIG. 2) of the device 200. Source regions 270 (and corresponding source contacts 230 on the top surface of the device 200) are adjacent both sides of each active gate structure (i.e., adjacent both opposing sidewalls of the trench within which a gate electrode 250 is formed). In contrast, according to an embodiment, a source region 272 is present on only one side of each edge termination structure (e.g., adjacent only one sidewall of the trench within which an edge electrode 260 is formed, or more specifically, the sidewall closest to or facing the active region of the device 200).

Body regions 276 of a second conductivity type (e.g., P type or N type) are present at the top surface of the device 200 between source regions 270, 272 of adjacent gate electrodes 250 and edge electrodes 260. The body regions 276 extend from the top surface downward toward the bottom surface (not shown in FIG. 2) of the semiconductor substrate 220 and underneath the source regions 270, 272. A remainder of the substrate 220, which has the first conductivity type, underlies the body regions 276. The source contacts 230 provide electrical connection to portions of the source regions 270, 272 and portions of the body regions 276.

FIG. 3 is a simplified cross-sectional view of the trench metal oxide semiconductor device 200 of FIG. 2 along line 3-3 of FIG. 2, according to an embodiment. More particularly, the cross-section depicted in FIG. 3 cuts through a portion of an edge region 308 of device 200 that includes an edge termination structure 350, and through a portion of an active region 310 of device 200. The edge termination structure 350 essentially consists of an edge electrode 260 and a gate oxide 240 formed within the trench associated with the edge electrode 260. The cross-section depicted in FIG. 3 does not cut through any active gate structure, although a portion of a source contact 230 within an active region 310 of the device 200 is depicted.

With continued reference to FIG. 2, the depicted portion of device 200 includes a semiconductor substrate 220 having a top surface 342 and a bottom surface 344. The semiconductor substrate 220 includes semiconductor layer 302 (e.g., single crystal silicon) of a first conductivity type and a first doping density (e.g., N+), which acts as the drain of device 200 and on which is provided drain contact 316 and drain connection 318. Layer 304 of the first conductivity type and a second, lesser doping density (e.g., N) is formed on layer 302, usually by epitaxy.

To form the edge termination structure 350, a gate structure is formed in a trench in the edge region 308 of the device 200. The trench extends from surface 342 into but not entirely through layer 304. A gate oxide 240 is formed on the exposed sidewalls and bottom of the trench. Conductive material (e.g., polycrystalline silicon) is disposed over the gate oxide 240 within the trench to provide an edge electrode 260. In the edge region 308 of the device 200, a conductive, gate feed structure 322 (e.g., polycrystalline silicon) overlies an oxide layer 306 and a field oxide region 320 on the top surface 342 of the substrate 220. The gate feed structure 322 is electrically coupled (e.g., directly coupled, as shown in FIG. 3) with the edge electrode 260 at an interface 323 between the edge electrode 260 and the gate feed structure 322. As the gate feed structure 322 may be formed using a process that results in a seamless, integrated interface between the edge electrode 260 and the gate feed structure 322, in an embodiment, the interface 323 is not depicted in the remaining Figures.

According to an embodiment, a body region 324 of a second conductivity type (e.g., P-type) extends from the top surface 342 of the substrate 220 into layer 304, abutting one side of the gate oxide 240 associated with the edge electrode 260. In addition, a source region 272 of the first conductivity type (e.g., N+) extends from the top surface 342 of the substrate 220 into the body region 324, also abutting one side of the gate oxide 240 associated with the edge electrode 260. More specifically, the source region 272 is adjacent the side of the edge termination structure 350 that faces the active region 310 of the device 200 (referred to herein as the "active region facing side" of the edge termination structure 350). FIG. 3 also depicts portions of a source region 270 and a source contact 230 associated with an active gate structure (not shown in FIG. 3). The components of the active gate structure will be described in more detail in conjunction with FIG. 4. An insulating layer 326 (e.g., tetraethyl orthosilicate (TEOS)) overlies the top surfaces of the substrate 220 and the gate feed structure 322.

Figure 4:
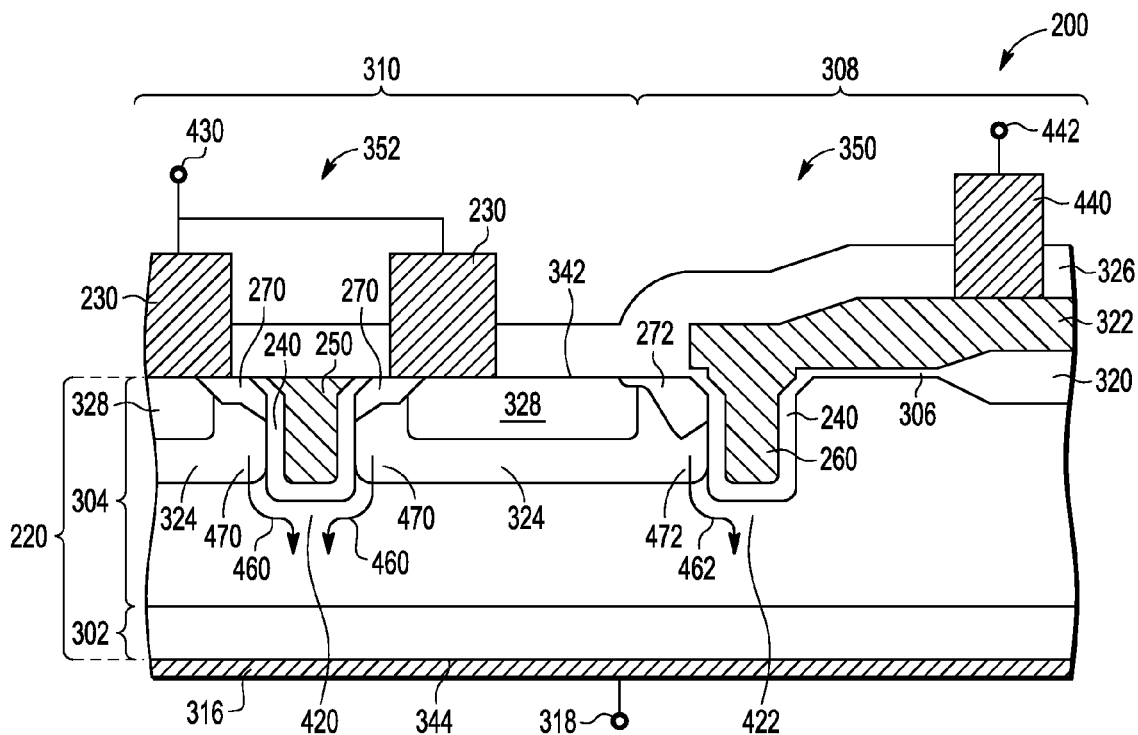
FIG. 4 is a simplified cross-sectional view of the trench metal oxide semiconductor device of FIG. 2 along a second axis according to an embodiment.
Figure 5:
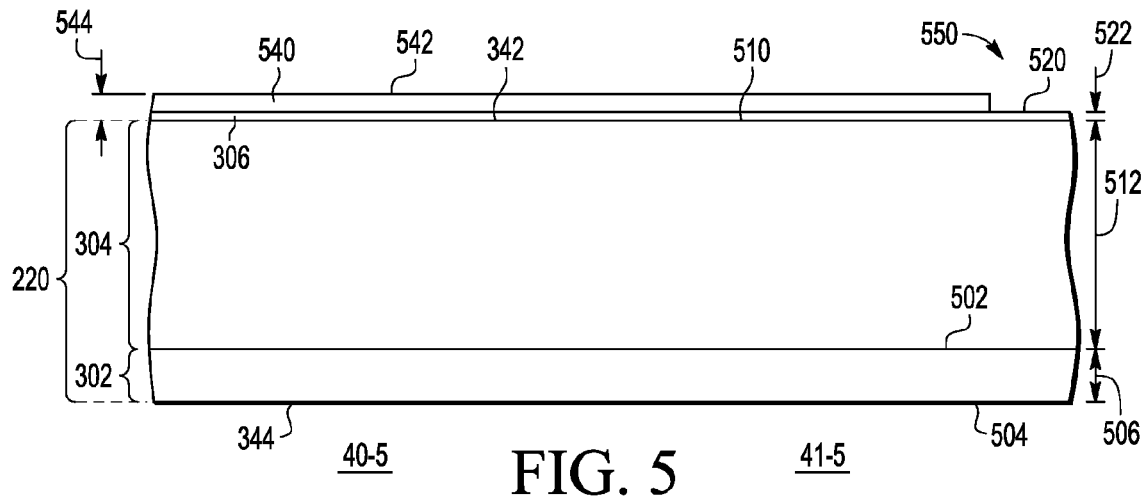
FIGS. 5-18 are simplified cross-sectional views of a trench metal oxide semiconductor device at different stages of manufacture, according to various embodiments.

FIG. 4 is a simplified cross-sectional view of the trench metal oxide semiconductor device 200 of FIG. 2 along line 4-4 of FIG. 2 according to an embodiment. More particularly, the cross-section depicted in FIG. 4 cuts through an edge region 308 of device 200 that includes an edge termination structure 350, and also cuts through an active region 310 of the device that includes an active gate structure 352. The edge termination structure 350 essentially consists of an edge electrode 260 and a gate oxide 240 formed within the trench associated with the edge electrode 260. The active gate structure 352 essentially consists of a gate electrode 250 and a gate oxide 240 formed within the trench associated with the gate electrode 250.

The edge termination structure 350 depicted in FIG. 4 is substantially the same as the edge termination structure 350 depicted in FIG. 3, and may be formed using the same processing steps. To form the active gate structure 352, a gate structure is formed in a trench in the active region 310 of the device 200. The trench extends from surface 342 into but not entirely through layer 304. According to an embodiment, the trench associated with the active gate structure 352 and the trench associated with the edge termination structure 350 have substantially the same depths and widths, although the depths and widths may be different, in other embodiments. Again regarding the active gate structure 352, a gate oxide 240 is formed on the exposed sidewalls and bottom of the trench for the active gate structure 352. Conductive material (e.g., polycrystalline silicon) is disposed over the gate oxide 240 within the trench to provide a gate electrode 250.

As discussed previously, in the active region 310 of the device 200, body regions 324 (e.g., P-type) extend from the top surface 342 of the substrate 220 into layer 304. According to an embodiment, body regions 324 formed between an active gate structure 352 and an edge termination structure 350 extend between facing sides of the gate oxides 240 associated with the gate electrode 250 and the edge electrode 260. Body regions 324 formed between adjacent active gate structures 352 (e.g., the body region 324 on the left side of device 200 in FIG. 4) extend between facing sides of the gate oxides 240 associated with the gate electrodes 250 of the adjacent active gate structures 352.

Enhanced body regions 328 (e.g., P+) extend partially into body regions 324 from the top surface 342, and the enhanced body regions 328 are generally centered within the body regions 324. Source regions 270, 272 (e.g., N+ type) are provided extending from surface 342 into body regions 324 and enhanced body regions 328. The active gate structure 352 is generally centered between source regions 270. More particularly, source regions 270 abut both sides of the active gate structure 352 (e.g., both sidewalls of the trench within which the active gate structure 352 is formed). Conversely, only one side of the edge termination structure 350 is abutted by a source region 272. More particularly, source region 272 is present abutting the side of the edge termination structure 350 that faces an adjacent active gate structure 352, or the active region facing side of the edge termination structure 350. According to an embodiment, no source region is present abutting the opposite side of the edge termination structure 350 (i.e., the side of the edge termination structure 350 that faces the side of the device 200, or the "device perimeter facing side").

Portions 420, 422 of layer 304 beneath the active gate structure 352 and the edge termination structure 350 act as the drift spaces of device 200. Contacts 230 are provided on source regions 270 (and enhanced body regions 328), and the contacts 230 are coupled to source connection 430. Contact 440 is provided on gate feed structure 322 and coupled to gate connection 442. Due to the integrated nature of the gate feed structure 322, the edge electrodes 260, and the gate electrodes 250 (see, e.g., FIG. 2), voltage applied via the gate connection 442 is applied simultaneously to each of the edge electrodes 260 and the gate electrodes 250. When appropriate bias is applied, source-drain current 460, 462 flows from source regions 270, 272 through channel regions 470, 472 in body regions 324 and through drift space portions 420, 422 of layer 304 to layer 302 which, as indicated above, acts as the drain of device 200.

FIGS. 5-18 are simplified cross-sectional views of trench metal oxide semiconductor structures 41-5 to 41-18 at different stages 40-5 to 40-18 of manufacture, according to various embodiments. Referring first to manufacturing stage 40-5 of FIG. 5, structure 41-5 comprises a device substrate 220 having an upper surface 342 and a lower surface 344. The device substrate 220 includes a semiconductor layer 302 (e.g., N+ silicon) on which is formed semiconductor layer 304 (e.g., N-type) and oxide layer 306. Semiconductor layer 302 has an upper surface 502, a lower surface 504, and thickness 506. For an N-channel device, semiconductor layer 302 is conveniently N+ silicon, arsenic doped to about 2E20 per $cm^3$ and with <100> oriented surfaces and about 0.003 Ohm*centimeter (cm) resistivity, but these specific parameters are not essential. The thickness 506 of semiconductor layer 302 is in a range of about 500 micrometers to about 1000 micrometers (e.g., about 700 micrometers), although the thickness 506 of semiconductor layer 302 may be larger or smaller, as well. For convenience of explanation, layer 302 is referred to as N+ silicon in the description of FIGS. 5-18, but this is merely by way of example and not intended to be limiting. Persons of skill in the art will understand that other materials, doping types, resistivities and orientations can also be used depending upon the particular type(s) of device desired to be formed.

Layer 304 (e.g., N-type) with upper surface 510 and thickness 512 is formed on upper surface 502 of layer 302, preferably by epitaxy. For an N-channel device, layer 304 is conveniently N-type silicon, phosphorus doped to about 0.2 to 1.5 Ohm*cm resistivity, typically 0.80 Ohm*cm resistivity for a 60 Volt rated device, but these parameters are not essential. The thickness 512 of layer 304 is in a range of about 2.0 micrometers to about 20.0 micrometers (e.g., about 5.2 micrometers, depending on the desired sustaining voltage drain to source of the device), although the thickness 512 of layer 304 may be larger or smaller, as well. Layer 304 is preferably in-situ doped, and the doping level and thickness 512 of layer 304 is adjusted to obtain a desired breakdown voltage. For convenience of explanation, layer 304 is referred to as N silicon in the description of FIGS. 5-18, but this is merely by way of example and not intended to be limiting. Persons of skill in the art will understand that other materials, doping types, and resistivities can also be used depending upon the particular type(s) of device desired to be formed. Chemical vapor deposition (CVD), low pressure chemical vapor deposition (LPCVD), reduced pressure chemical vapor deposition (RPCVD) or atmospheric pressure chemical vapor deposition (APCVD), and molecular beam epitaxy (MBE) are well known methods useful for forming layer 304. Ultra-high vacuum chemical vapor deposition UHV-CVD can also be used.

Oxide layer 306 with upper surface 520 and thickness 522 is conveniently formed on upper surface 510 of layer 304. The thickness 522 of oxide layer 306 is in a range of about 0.06 micrometers to about 0.10 micrometers (e.g., about 0.08 micrometers), although the thickness 522 of oxide layer 306 may be larger or smaller, as well. Silicon dioxide is a non-limiting example of a suitable material for oxide layer 306, but other generally refractory inert materials can also be used. Non-limiting examples, of other useful materials for oxide layer 306 are low temperature silicon oxide (LTO), oxide formed by plasma enhanced reaction of tetra-ethyl-ortho-silicate (PETEOS), silicon nitride, combinations thereof, and other materials. Accordingly, use of the word "oxide" in connection with layer 306 is merely for convenience of identification and not intended to be limiting and should be understood to include such other alternatives. CVD, LPCVD, or plasma enhanced chemical vapor deposition (PECVD) are examples of suitable techniques for forming oxide layer 306, but other formation techniques are not precluded.

Silicon nitride layer 540 (referred to below as "nitride layer") with an upper surface 542 is formed on the upper surface 520 of oxide layer 306. Nitride layer 540 desirably has a thickness 544 in a range of about 0.10 micrometers and about 0.20 micrometers (e.g., about 0.14 micrometers), although the thickness 544 of nitride layer 540 may be larger or smaller, as well. According to an embodiment, a portion of nitride layer 540 is selectively removed (e.g., using photolithography and etching processes) to produce an opening 550 that exposes a portion of the underlying oxide layer 306. According to an embodiment, the nitride layer 540, once etched, overlies the eventual active region 310 (FIGS. 3, 4) and a portion of the edge region 308 (FIGS. 3, 4) of the device 200. Nitride layer 540 functions to prevent field oxide growth in the active region 310 during subsequent processing steps (e.g., manufacturing stage 40-6, FIG. 6). Structure 41-5 results.

Figure 6:
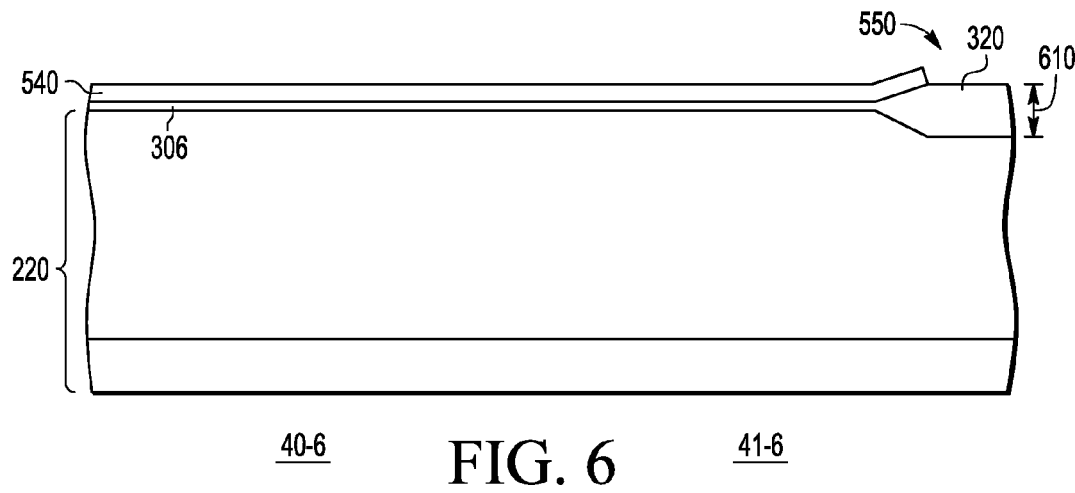

Referring now to manufacturing stage 40-6 of FIG. 6, a field oxide region 320 is formed to provide a silicon oxide insulating structure to insulate device 200. For example, field oxide region 320 may be formed using a LOCOS (LOCal Oxidation of Silicon) process. More specifically, using a thermal oxidation process at a temperature between about 800 and about 1200 degrees Celsius (e.g., about 1000 degrees Celsius), oxygen is diffused into the portion of oxide layer 306 that is exposed through opening 550 in nitride layer 540, resulting in the formation of field oxide region 320. Field oxide region 320 desirably has a thickness 610 in a range of about 0.70 micrometers to about 0.80 micrometers (e.g., about 0.77 micrometers), although the thickness 610 of field oxide region 320 may be larger or smaller, as well. Structure 41-6 results.

Figure 7:
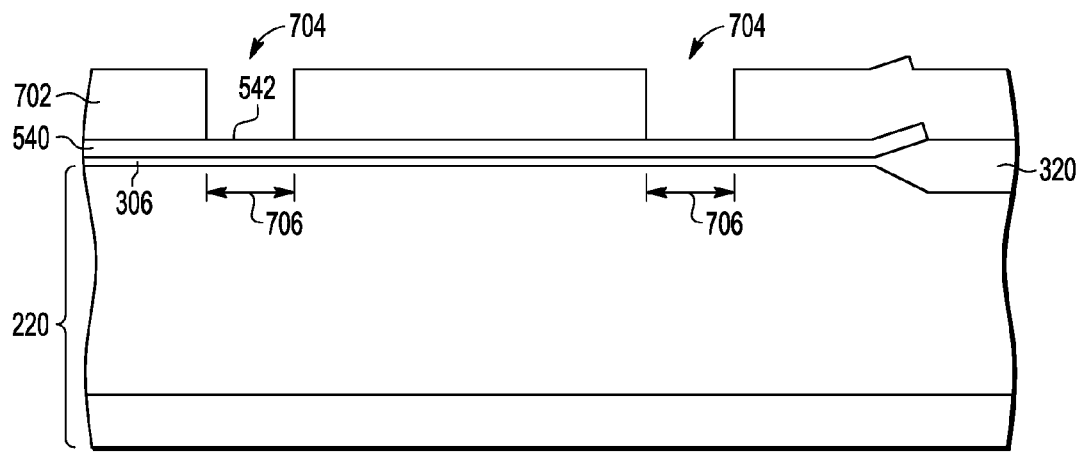

Referring now to manufacturing stage 40-7 of FIG. 7, etch mask 702, of for example photo-resist, with openings 704 is provided on outer surface 542 of nitride layer 540 and the surface of field oxide region 320. Openings 704 have sizes, shapes, and locations where it is desired to provide conductor filled trenches (e.g., corresponding to gate electrodes 250 and edge electrodes 260, FIGS. 2-4). For example, openings 704 may have a width 706 in a range of about 0.40 micrometers to about 0.50 micrometers (e.g., about 0.45 micrometers), although the width 706 of openings 704 may be larger or smaller, as well. Etch mask 702 may be, for example, silicon nitride, silicon oxide, oxide-nitride combinations or other masking materials. Openings 704 are provided in etch mask 702 using any convenient technique, as for example and not intended to be limiting, photo-resist application and patterning. While only two openings 704 are illustrated in FIG. 7 and subsequent figures, persons of skill in the art will understand that more openings (and correspondingly more trenches 810, 812, FIG. 8) may be provided so as to yield, in later manufacturing stages, the configuration of trenches, gates, and edge structures. Structure 41-7 results.

Figure 8:
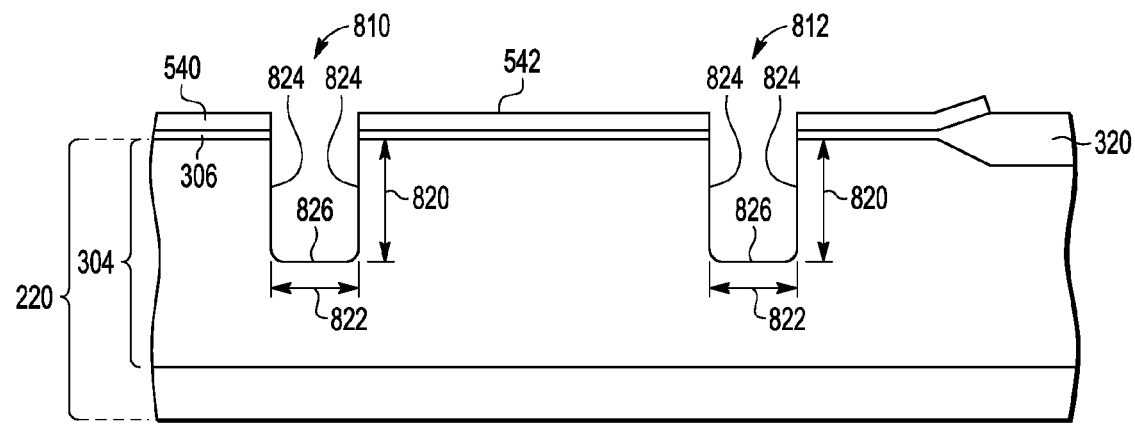

In manufacturing stage 40-8 of FIG. 8, nitride layer 540 and oxide layer 306 are etched through openings 704 (FIG. 7) to expose portions of the top surface 510 of layer 304, and the etch mask 702 (FIG. 7) is removed. With the nitride layer 540 and the oxide layer 306 functioning as a hard mask, layer 304 is subsequently etched through the openings in nitride layer 540 and oxide layer 306 to form at least one active-region trench 810 and at least one edge-region trench 812. Referring also to FIG. 2, forming the active-region trenches 810 includes forming a plurality of parallel trenches in the active region 310 of the device (e.g., trenches corresponding to gate electrodes 250, FIG. 2), and forming the edge-region trenches 812 includes forming a plurality of trench segments in the edge region 308 of the device (e.g., trenches corresponding to edge electrodes 260, FIG. 2), in an embodiment. For example, in the embodiment illustrated in FIG. 2, the edge-region trenches 812 would include at least four trench segments in the edge region of the device. A first trench segment is proximate to and parallel with a first side 261 of the device and is parallel with the gate structures (including the gate electrodes 250). A second trench segment is proximate to and parallel with the second side 262 of the device and is perpendicular to the first trench segment and the gate structures. A third trench segment is proximate to and parallel with the third side 263 of the device and is parallel with the first trench segment and the gate structures and perpendicular to the second trench segment. Finally, a fourth trench segment is proximate to and parallel with the fourth side 264 of the device and is parallel with the second trench segment and perpendicular to the first and third trench segments and the gate structures.

Each of trenches 810, 812 are at least partially defined by a depth 820 from the top surface 510 of layer 304, a width 822, sidewalls 824, and a bottom 826. Depth 820 is usefully in the range of about 0.90 to about 1.2 micrometers (e.g., about 1.05 micrometers), but larger or smaller values may also be used. Width 822 is usefully in the range of about 0.4 to about 0.5 micrometers (e.g., about 0.45 micrometers), but larger or smaller values may also be used. For the etching processes used to etch the nitride layer 540, oxide layer 306, and layer 304, an anisotropic etch may be used, which preferentially etches substantially perpendicular to surface 542 rather than isotropically, so as to form trenches 810, 812. For example, but not by way of limitation, etching is preferably performed by one or more reactive ion etching (ME) or deep RIE (DRIE) processes (e.g., a first RIE process to etch nitride layer 540 and oxide layer 306, and a second ME process to etch layer 304). According to an embodiment, the semiconductor material surrounding trenches 810, 812 may be slightly etched (e.g., using a wet etching process) to round the corners of trenches 810, 812 so as to mitigate potential high electric field concentrations at sharp corners of trenches 810, 812 that may have resulted from the previous etching processes. Alternatively, a sacrificial oxide (not illustrated) may be formed on the sidewalls 824 and bottoms 826 of trenches 810, 812 (e.g., using a hot, dry oxidation process at temperatures in a range of about 1000 degrees Celsius to about 1200 degrees Celsius). The sacrificial oxide may then be removed (e.g., etched), resulting in a rounding of the corners at the intersection between the sidewalls 824 and the bottom 826 of each of the trenches 810, 812. Structure 41-8 results.

Figure 9:
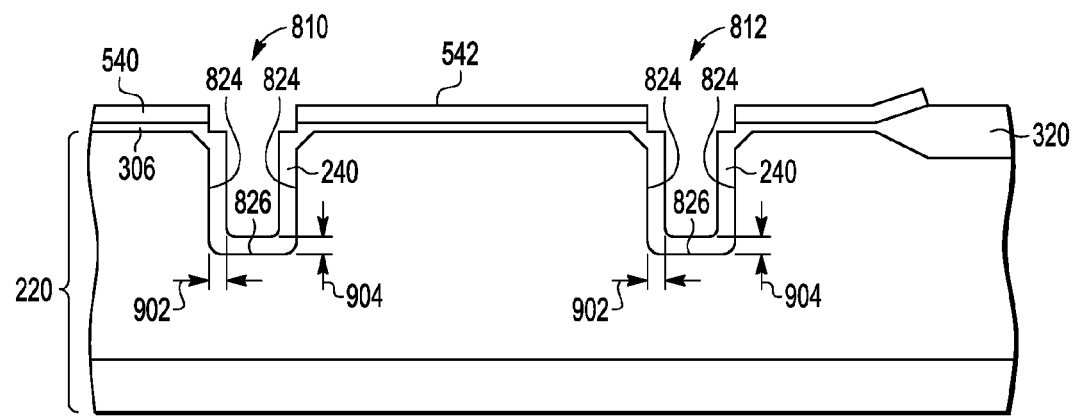

In manufacturing stage 40-9 of FIG. 9, trenches 810, 812 formed in manufacturing stage 40-8 of FIG. 8 are conformally lined with gate oxide 240. For example, gate oxide 240 may be thermally grown using a wet oxidation process at a temperature in a range of about 800 degrees Celsius to about 1000 degrees Celsius (e.g., about 900 degrees Celsius). Alternatively, other oxidation processes may be used to form gate oxide 240, including oxide deposition processes. Gate oxide 240 may be a substantially homogenous layer in some embodiments, and in other embodiments a multi-layer structure. According to an embodiment, gate oxide 240 on sidewalls 824 of trenches 810, 812 has a thickness 902 in the range of about 0.060 to about 0.080 micrometers (e.g., about 0.070 micrometers), and gate oxide 240 on bottoms 826 of trenches 810, 812 has a thickness 904 in the range of about 0.050 to about 0.070 micrometers (e.g., about 0.060 micrometers), but larger or smaller values may also be used. Structure 41-9 results.

Figure 10:
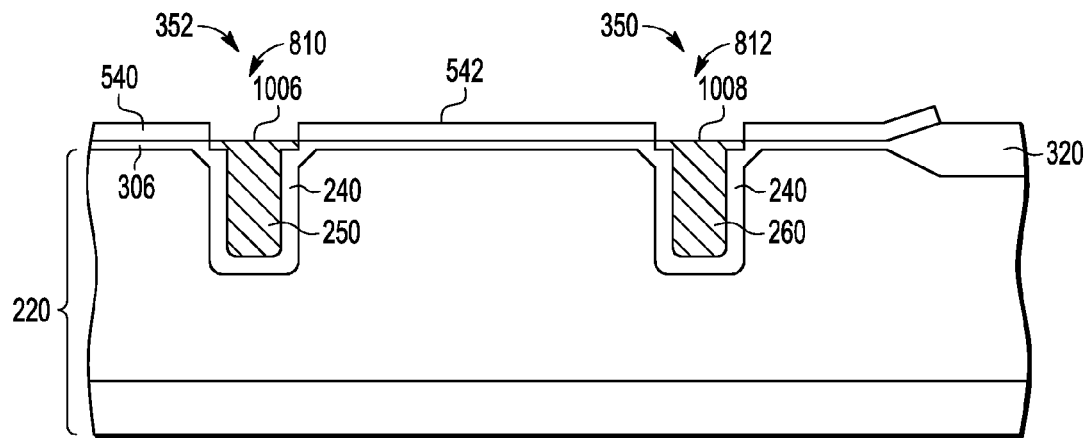

In manufacturing stage 40-10 of FIG. 10, conductive material (e.g., polycrystalline silicon) is deposited in trenches 810, 812 to form a conductive gate electrode 250 and a conductive edge electrode 260. Desirably, gate electrode 250 and edge electrode 260 have top surfaces 1006, 1008 approximately at or above the surface of the gate oxide 240 at the top of trenches 810, 812. According to an embodiment, gate electrode 250 and edge electrode 260 are formed by depositing a layer of polycrystalline silicon over the top surface 542 of nitride layer 540 and over gate oxide 240 in trenches 810, 812, where the thickness of the polycrystalline silicon layer is sufficient to fill trenches 810, 812. Alternatively, the thickness of the polycrystalline silicon layer may only partially fill trenches 810, 812, and the unfilled portion of the trenches 810, 812 will later be filled during a subsequent manufacturing stage (e.g., manufacturing stage 40-12, described later). Either way, an etch back process (e.g., a reactive ion etch process) is performed to remove portions of the polycrystalline silicon layer overlying nitride layer 540. According to an embodiment, the polycrystalline silicon layer is in-situ (e.g., N+) doped polycrystalline silicon. This process results in the formation of edge termination structure 350 and active gate structure 352. Structure 41-10 results.

Figure 11:
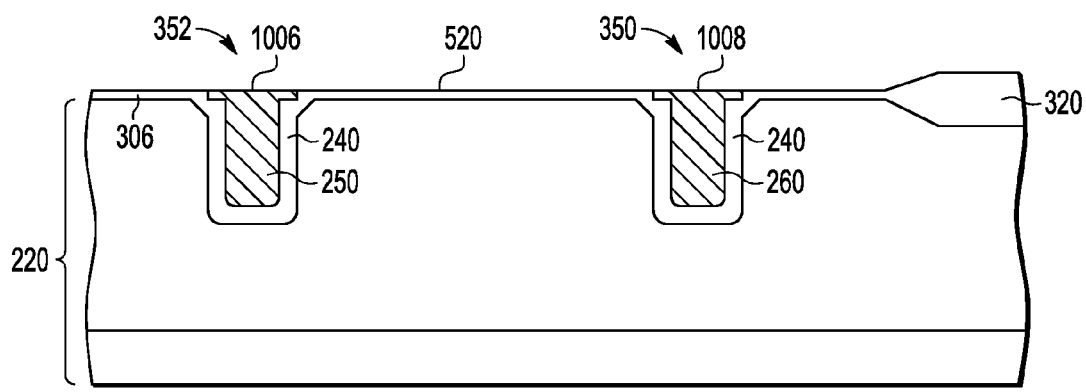

In manufacturing stage 40-11 of FIG. 11, nitride layer 540 (FIG. 10) is removed. For example, nitride layer 540 may be removed using a wet etch process (e.g., a hot phosphoric acid wet etch). After the nitride layer 540 is removed, the top surface 520 of oxide layer 306 is again exposed. Structure 41-11 results.

Figure 12:
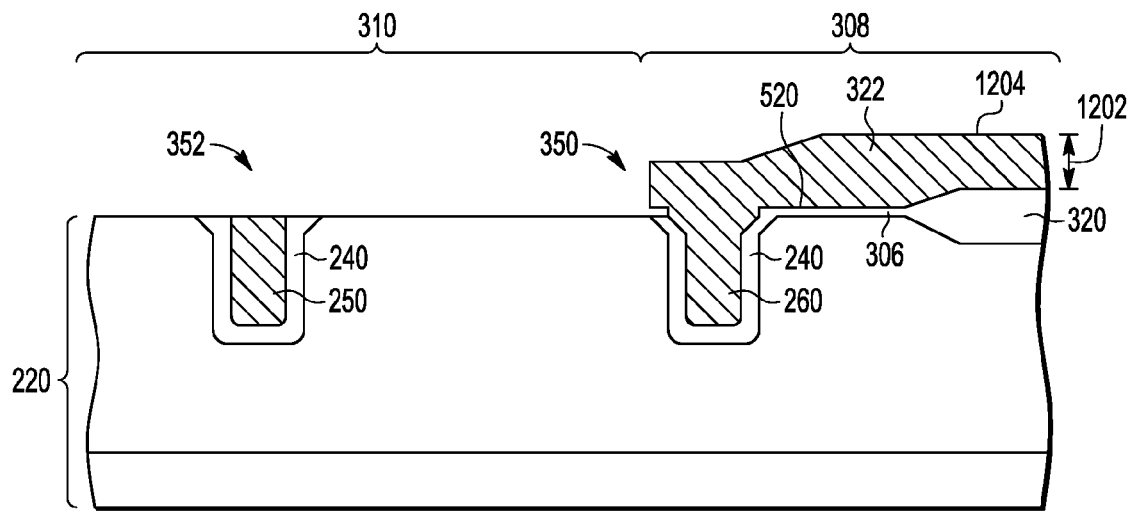

In manufacturing stage 40-12 of FIG. 12, a conductive gate feed structure 322 is formed in contact with the edge termination structure 350. According to an embodiment, the conductive gate feed structure 322 overlies the top surface 1008 (FIG. 11) of edge electrode 260, and extends at least to the perimeter of the device (e.g., to one or more of sides 261-264, FIG. 2), in an embodiment. In other words, the conductive gate feed structure 322 substantially overlies the edge region 308 of the device, and is substantially absent over the active region 310 of the device, in an embodiment. The conductive gate feed structure 322 may have a thickness 1202 in a range of about 0.2 micrometers to about 1.2 micrometers, although the thickness 1202 may be greater or less, as well. According to an embodiment, the conductive gate feed structure 322 is formed by depositing a layer of polycrystalline silicon over the top surface 520 of oxide layer 306 (and field oxide region 320), and the top surfaces 1006, 1008 (FIG. 11) of gate electrode 250 and edge electrode 260. Subsequently, an etch-stop mask (not illustrated) is applied to a portion of the top surface 1204 of the polycrystalline silicon layer that coincides with the edge region 308, and the unmasked portion of the polycrystalline silicon layer (i.e., the portion that coincides with the active region 310) is etched away (e.g., using RIE). A reoxidation process may then be performed to provide fresh oxide material (not illustrated in FIG. 12 or subsequent Figures) at upper portions of the gate oxide 240, according to an embodiment. Structure 41-12 results.

Figure 13:
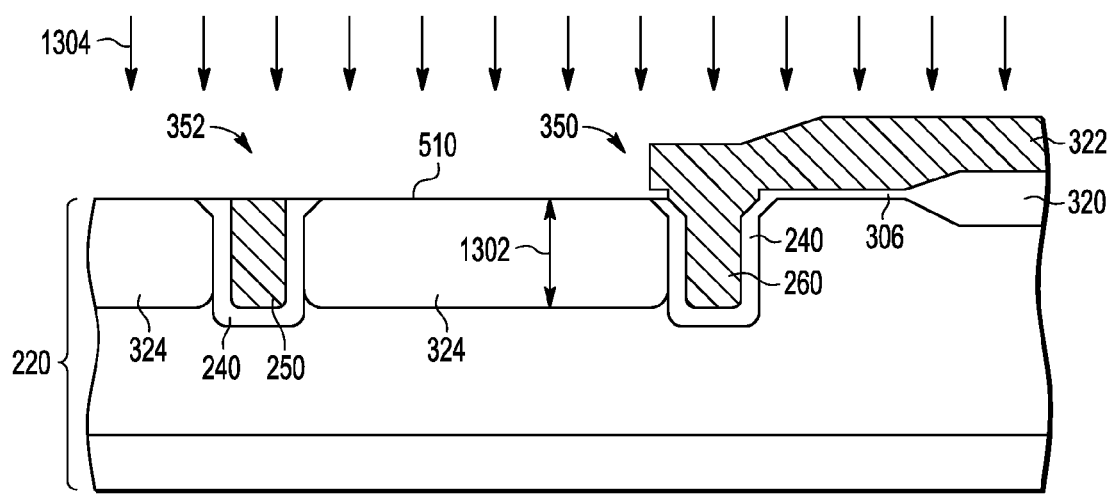

In manufacturing stage 40-13 of FIG. 13, P body regions 324 are formed between the edge termination structure 350 and the active gate structure 352, and also between adjacent active gate structures (e.g., active gate structure 352 and an adjacent active gate structure (not illustrated) that may be present to the left of active gate structure 352 in FIG. 13). According to an embodiment, body regions 324 extend from surface 510 of substrate 220 to a depth 1302 approximately equal to the depth of gate and edge electrodes 250, 260, although body regions 324 may be shallower, as well. According to an embodiment, body regions 324 are formed using a PHV (High Voltage P-region) implant 1304 followed by a thermal anneal (e.g., a thermal anneal at about 1050 degrees Celsius for about 80 minutes). For example, the PHV implant may use boron as a dopant, although other dopants may be used, as well. According to an embodiment, an implant energy in a range of about 40 to about 150 keV and a zero degree implant angle are employed. Body regions 324 have doping densities in a range of about 1E13 to about 1E14 per $cm^3$ (e.g., 1.2E13 per $cm^3$), but lower and higher doping densities can also be used depending upon the particular device characteristics that are desired. Persons of skill in the art will understand how to choose appropriate doping densities and profiles for body regions 324 depending upon the particular type of device they intend to fabricate. Structure 41-13 results.

Figure 14:
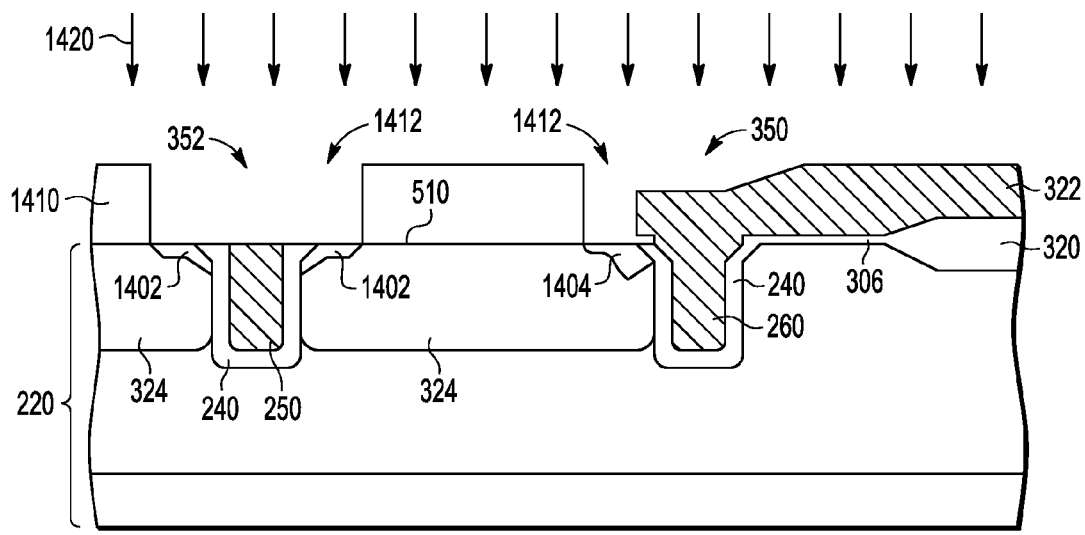

In manufacturing stage 40-14 of FIG. 14, preliminary source regions 1402, 1404 are formed. Preliminary source regions 1402, 1404 extend partially into body regions 324 from top surface 510 of substrate 220. Preliminary source regions 1402 are adjacent both sides of active gate structure 352. Conversely, a preliminary source region 1404 is adjacent only one side of edge termination structure 350 (i.e., the "active region facing side"). According to an embodiment, to form preliminary source regions 1402, 1404, a patterned photoresist layer 1410 is applied to the top surface 510 of substrate 220, with openings 1412 corresponding to desired locations of preliminary source regions 1402, 1404. An N-region implant 1420 may then be performed. According to an embodiment, the N-region implant 1420 may include a first implant step using phosphorus as a dopant, and a subsequent second implant step using arsenic as a dopant, although other dopants may be used, as well. For example, during the phosphorus implant step, an implant energy in a range of about 50 to about 60 keV and a zero degree implant angle may be employed, and during the arsenic implant step, an implant energy in a range of about 75 to about 85 keV and a zero degree implant angle may be employed. The phosphorus implant may have a doping density in a range of about 1E15 to about 1E16 per cm$^3$ (e.g., 1.5E15 per cm$^3$), and the arsenic implant may have a doping density in a range of about 1E15 to about 1E16 per cm$^3$ (e.g., 6E15 per cm$^3$), but lower and higher doping densities can also be used depending upon the particular device characteristics that are desired. Persons of skill in the art will understand how to choose appropriate doping densities and profiles for preliminary source regions 1402, 1404 depending upon the particular type of device they intend to fabricate. Structure 41-14 results.

Figure 15:
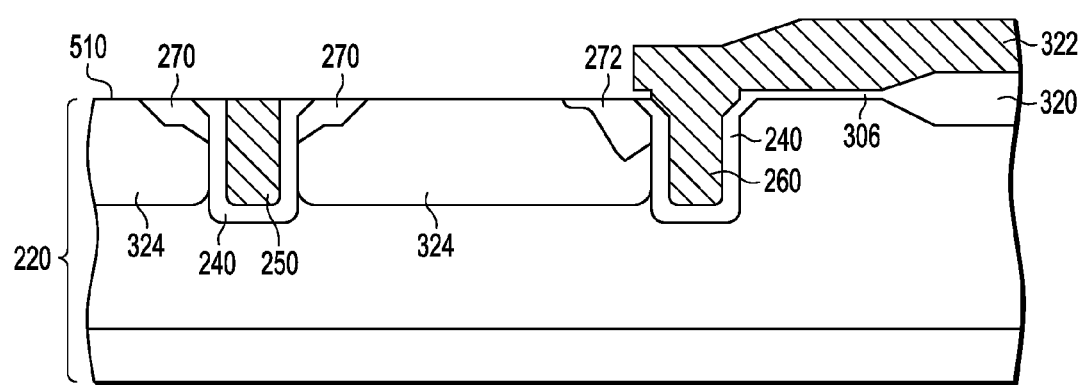

In manufacturing stage 40-15 of FIG. 15, photoresist layer 1410 (FIG. 14) is removed, and a thermal anneal process is performed to diffuse the preliminary source regions 1402, 1404 (FIG. 14) deeper into body regions 324, resulting in N+ source regions 270, 272. For example, the thermal anneal process may include heating the device at temperature of about 900 degrees Celsius for about 30 minutes, although higher or lower temperatures and/or longer or shorter anneal times may be used, as well. Structure 41-15 results.

Figure 16:
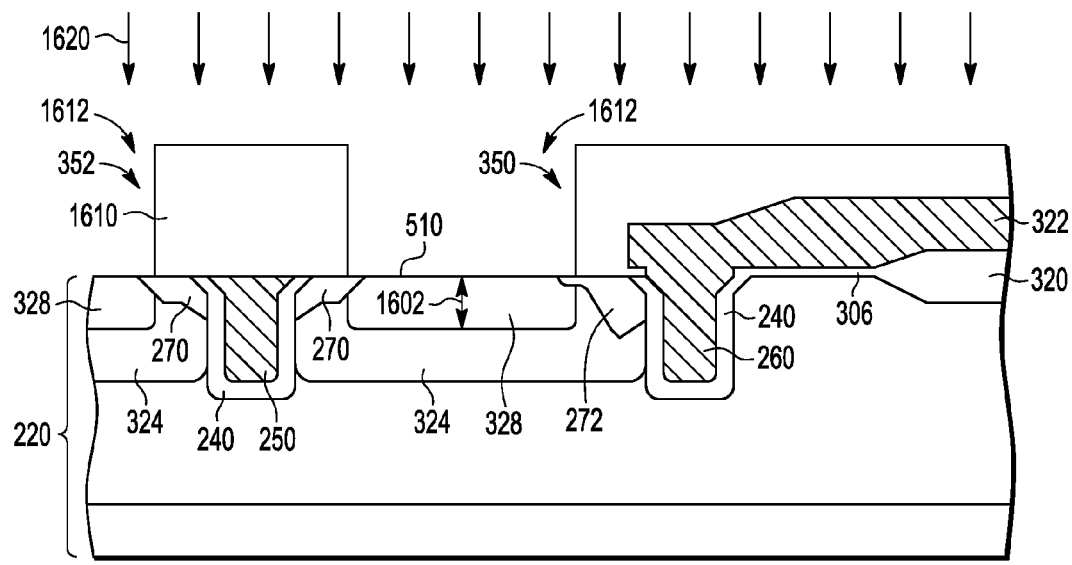

In manufacturing stage 40-16 of FIG. 16, P+ body enhancement regions 328 are formed in body regions 324. Body enhancement regions 328 extend into body regions 324 from top surface 510 to a depth 1602 that is less than the depth of body regions 324. Body enhancement regions 328 span the distance between source regions 270, 272 associated with adjacent active gate structures 352 and edge termination structures 350. In addition, body enhancement regions 328 at least partially underlie source regions 270, 272, although body enhancement regions 328 do not extend all the way to the gate oxides 240 associated with the active gate structures 352 and the edge termination structures 350. According to an embodiment, to form body enhancement regions 328, a patterned photoresist layer 1610 is applied to the top surfaces 510, 1006 (FIG. 10), 1008 (FIG. 10), 1204 (FIG. 12) of substrate 220, electrodes 250, 260, and gate feed structure 322, with openings 1612 corresponding to desired locations of body enhancement regions 328. A P-region implant 1620 may then be performed. According to an embodiment, the P-region implant 1620 may include one or more implant steps with a zero degree implant angle and using boron as a dopant, although other dopants may be used, as well. For example, the implant steps may include a first implant step at an implant energy in a range of about 210 to about 230 keV, a second implant step at an implant energy in a range of about 70 to about 90 keV, and a third implant step at an implant energy in a range of about 20 to about 30 keV. The first implant step may result in a doping density at a first depth in a range of about 1E12 to about 1E14 per cm$^3$ (e.g., 1.0E13 per cm$^3$), the second implant step may result in a doping density at a second depth in a range of about 1E15 to about 1E16 per cm$^3$ (e.g., 2.0E15 per cm$^3$), and the third implant step may result in a doping density at a third depth in a range of about 1E15 to about 1E16 per cm$^3$ (e.g., 1.2E15 per cm$^3$), but lower and higher doping densities can also be used depending upon the particular device characteristics that are desired. Persons of skill in the art will understand how to choose appropriate doping densities and profiles for body enhancement regions 328 depending upon the particular type of device they intend to fabricate. After removing photoresist layer 1610, a thermal anneal process is performed to diffuse the body enhancement regions 328 deeper into body regions 324. For example, the thermal anneal process may include heating the device at temperature of about 1000 degrees Celsius for about 2 minutes, although higher or lower temperatures and/or longer or shorter anneal times may be used, as well. Structure 41-16 results.

Figure 17:
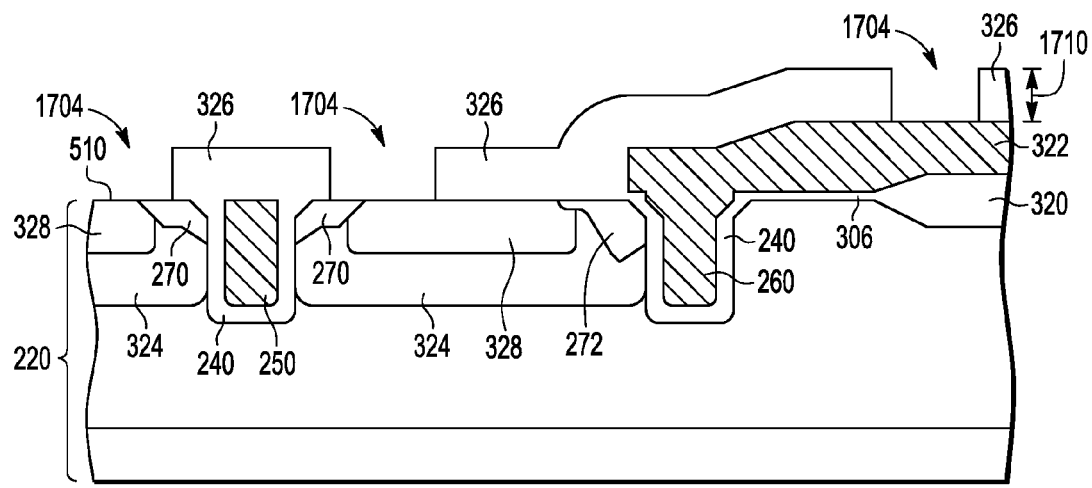

In manufacturing stage 40-17 of FIG. 17, a patterned insulating layer 326 is formed overlying the top surfaces 510, 1006 (FIG. 10), 1008 (FIG. 10), 1204 (FIG. 12) of substrate 220, electrodes 250, 260, and gate feed structure 322, with openings 1704 corresponding to desired locations for source contacts and gate contacts. For example, insulating layer 326 may include a layer of tetraethyl orthosilicate (TEOS). According to an embodiment, insulating layer 326 has a thickness 1710 in a range of about 0.3 micrometers to about 1.0 micrometer, although insulating layer 326 may be thicker or thinner, as well. Structure 41-17 results.

Figure 18:
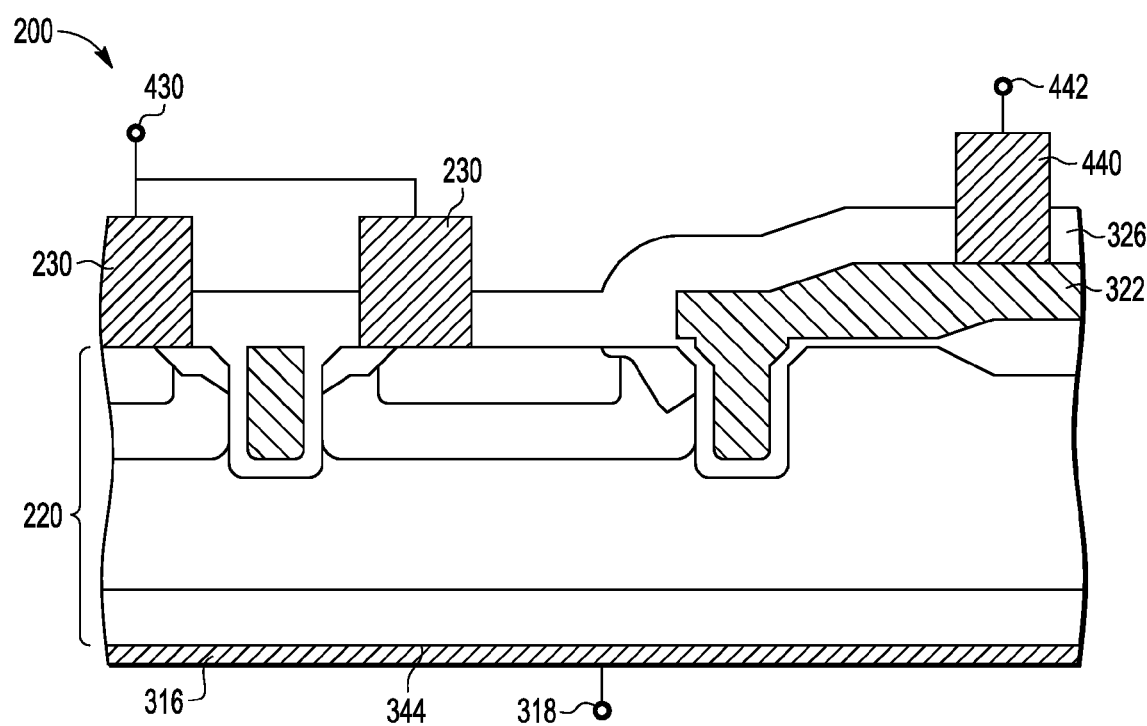

In manufacturing stage 40-18 of FIG. 18, source contacts 230 and gate contact 440 are formed in locations that correspond to the openings 1704 (FIG. 17) in patterned insulating layer 326. For example, source contacts 230 and gate contact 440 may be formed by depositing one or more metal layers over the surface of the patterned insulating layer 326 and portions of the surface 510 of substrate 220 and gate feed structure 322 exposed through the openings 1704. A patterned photoresist layer may then be applied over the metal layers, with the pattern corresponding to the locations of contacts 230, 440. The exposed portions of the metal layers are then etched, and the photoresist layer is removed, resulting in source contacts 230 and gate contact 440. A drain contact 316 (e.g., of a layer of metal) also is formed on the bottom surface 344 of substrate 220. Contacts 230, 440, and 316 are coupled to source connection 430, gate connection 442, and drain connection 318, respectively. Device 200 and structure 41-18 results.

Figure 19:
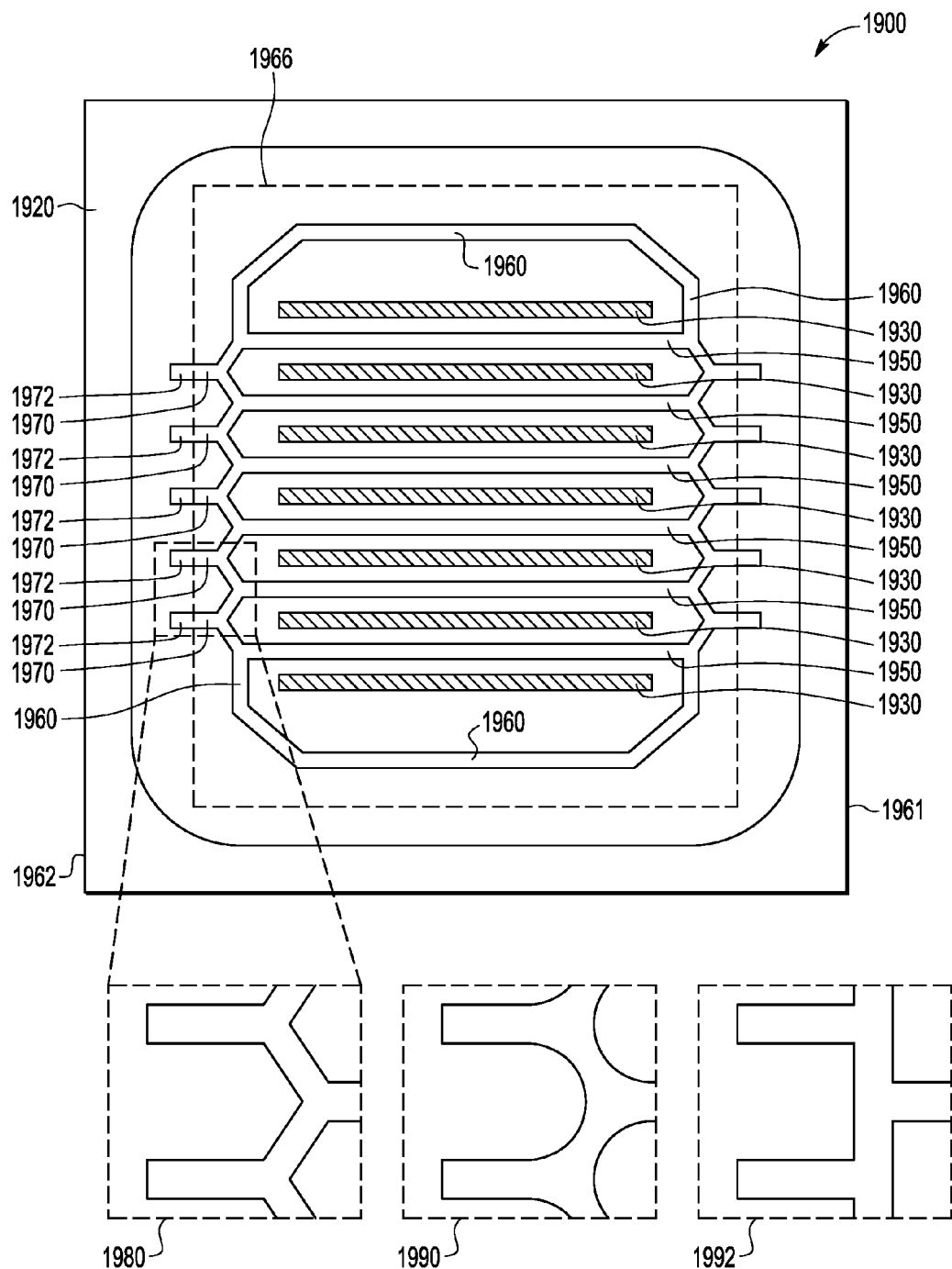
FIG. 19 is a simplified top-view of a trench metal oxide semiconductor device according to another embodiment.

FIG. 19 is a simplified top-view of a trench metal oxide semiconductor device 1900 employing a trench structure for the control gate, according to another embodiment. As with FIG. 2, FIG. 19 is intended primarily to depict an example layout of various gate structures and edge termination structures of device 1900. The gate structures each include a gate electrode 1950, and the edge termination structures each include an edge electrode 1960. Each of the gate electrodes 1950 and edge electrodes 1960 are formed within a trench in a semiconductor substrate 1920. FIG. 19 also depicts an example layout of source contacts 1930 disposed between the gate electrodes 1950 and edge electrodes 1960.

According to an embodiment, at least some of the edge termination structures include extension electrodes 1970 that extend from the sides of at least some of the edge electrodes 1960 outward toward the sides (e.g., sides 1961, 1962) of device 1900. Except for the inclusion of extension electrodes 1970 and the extent of a conductive gate feed structure (with an inward extent indicated by dashed box 1966), device 1900 and its method of fabrication are substantially similar to device 200 and its method of fabrication discussed in conjunction with FIGS. 2-18. More particularly, in FIGS. 2 and 19, the edge electrodes 260, 1960 may be formed in a plurality of trench segments that substantially surround the gate electrodes 250, 1950 and the active regions of the devices 200, 1900. In the embodiment of FIG. 2, the gate feed structure (e.g., gate feed structure 322, FIG. 3) extends over (and conductively contacts) the rectangularly-configured edge electrodes 260 (as indicated by dashed box 266 in FIG. 2). In contrast, in the embodiment illustrated in FIG. 19, the gate feed structure extends over (and conductively contacts) the outward ends 1972 of the extension electrodes 1970 (as indicated by dashed box 1966, which represents the inward extent of the gate feed structure). The extension electrodes 1970 may be considered to be part of the edge termination structures.

In FIG. 19, extension electrodes 1970 are shown to extend from two sides of the enclosed configuration of edge electrodes 1960 (e.g., device-perimeter facing sides corresponding to two trench segments that are perpendicular to the gate electrodes 1950). According to an embodiment, and as shown in FIG. 19, the edge electrodes 1960 from which the extension electrodes 1970 extend are shown to have a zig-zag (rather than straight) configuration. Thus, the trench segments within which those edge electrodes 1960 are included are formed with the zig-zag configuration. According to an embodiment, the zig-zag configuration may be angular (e.g., consisting of a series of straight parallel trench walls that intersect at angles), as shown in detail 1980 of FIG. 19. In an alternate embodiment, the zig-zag configuration may be more rounded (e.g., consisting of a series of curved parallel trench walls that intersect smoothly at turning points), as shown in alternate detail 1990 of FIG. 19. In the latter embodiment, gate leakage in the termination area may be reduced. In still other embodiments, the zig-zag configuration may include a combination of straight and/or curved parallel trench walls that intersect at angles and/or smooth turning points. Either way, the zig-zag configuration of edge electrodes 1960 may be advantageous to reduce the intersection angles between the edge electrodes 1960 and the extension electrodes 1970. Alternatively, the extension electrodes 1970 may extend from substantially straight edge electrodes 1960 (e.g., at substantially right angles or at curved intersections), as shown in alternate detail 1992 of FIG. 19, for example. Similar to the gate and edge electrodes 1950, 1960, the extension electrodes 1970 are formed within trenches in the substrate 1920, and the extension electrodes 1970 may be insulated from the substrate 1920 by a gate oxide (e.g., gate oxide 240, FIG. 2). The extension electrodes 1970 may be formed during the same fabrication steps as are used to form the gate and edge electrodes 1950, 1960.

Although the extension electrodes 1970 are shown to extend from edge electrodes 1960 having principal axes that are aligned in a direction perpendicular to the gate electrodes 1950, edge electrodes 1970 also or alternatively may extend from edge electrodes 1960 having principal axes that are aligned in a direction parallel to the gate electrodes 1950. In addition, although extension electrodes 1970 are shown to extend from two sides of the rectangular configuration of edge electrodes 1960, extension electrodes 1970 may extend from more or fewer sides of a configuration of edge electrodes 1960. In addition, although a particular number of gate electrodes 1950, edge electrodes 1960, and extension electrodes 1970 are shown, a device may include more or fewer gate electrodes 1950, edge electrodes 1960, and/or extension electrodes 1970.

Figure 20:
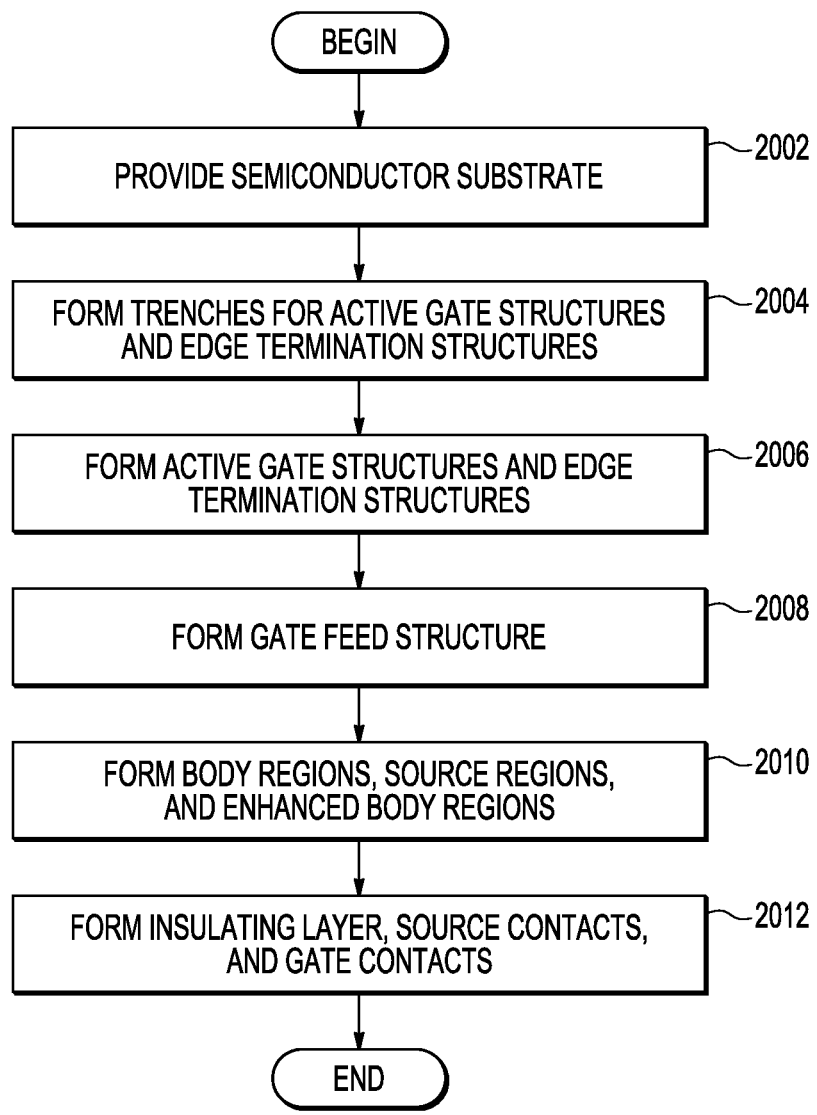
FIG. 20 is a simplified flow diagram illustrating methods for forming the devices illustrated, for example in FIGS. 2-19, according to still further embodiments.

FIG. 20 is a simplified flow diagram illustrating methods for forming the structures identical or similar to those illustrated in FIGS. 2-19, according to an embodiment. The method begins, in block 2002, by providing a semiconductor substrate. For example, as discussed in conjunction with FIG. 5, the semiconductor substrate may include a layer 302 (e.g., N+ silicon) on which is formed (e.g., by epitaxy) a semiconductor layer 304. An oxide layer (e.g., oxide layer 306, FIG. 5) and a nitride layer (e.g., nitride layer 540, FIG. 5) may be formed on a top surface of the substrate. A field oxide region (e.g., field oxide region 320, FIG. 6) may be formed by patterning the nitride layer and employing an oxidation process (e.g., LOCOS).

In block 2004, trenches are formed for active gate structures and edge termination structures (including trenches for extension electrodes, when included). For example, as described in conjunction with FIGS. 7-8, a patterned etch mask may be used to selectively etch the nitride and oxide layers (e.g., layers 306, 540, FIG. 7) in areas in which the trenches are desired. The etch mask may then be removed, and the trenches (e.g., trenches 810, 812, FIG. 8) may then be etched into the upper substrate layer (e.g., layer 304, FIG. 8) using the nitride and oxide layers as a hard mask.

In block 2006, active gate structures and edge termination structures (e.g., structures 352, 350, FIG. 10) are formed. For example, this may include conformally lining the trenches (e.g., trenches 810, 812, FIG. 8) with a gate oxide (e.g., gate oxide 240, FIG. 9), and filling the oxide-lined trenches with conductive material (e.g., polycrystalline silicon) to form gate electrodes (e.g., gate electrodes 250, FIG. 10) and edge electrodes (e.g., edge electrodes 260, FIG. 10).

In block 2008, a conductive gate feed structure is formed. For example, this may include forming a conductive structure (e.g., e.g., conductive gate feed structure 322, FIG. 12, of polycrystalline silicon) over and in contact with top surfaces of edge electrodes (e.g., edge electrodes 260, FIG. 12) or extension electrodes (e.g., extension electrodes 1970, FIG. 19). According to an embodiment, the conductive gate feed structure is primarily formed in an edge region (e.g., edge region 308, FIG. 12) of the device, and extends from the edge electrodes (or the extension electrodes) to at least one side of the device.

In block 2010, body regions, source regions, and enhanced body regions are formed. For example, as described in conjunction with FIGS. 13-16, various masking, implantation, and annealing processes may be performed to form body regions (e.g., body regions 324, FIG. 13), source regions (e.g., source regions 270, 272, FIG. 15), and enhanced body regions (e.g., enhanced body regions 328, FIG. 16) in the device between the various edge termination structures and active gate structures.

In block 2012, an insulating layer is formed, along with forming source, gate, and drain contacts and their associated connectors. For example, as described in conjunction with FIGS. 17 and 18, a patterned insulating layer (e.g., layer 326, FIG. 17) may be formed over the top surface of the device, with openings (e.g., openings 1704, FIG. 17) corresponding to desired locations of source and gate contacts. Conductive material may then be deposited in the openings to produce source and gate contacts (e.g., source and gate contacts 230, 440, FIG. 18). A drain contact (e.g., drain contact 316, FIG. 18) may be formed on the bottom surface of the substrate, and connections (e.g., connections 430, 442, 318, FIG. 18) may be formed to the source, gate, and drain contacts. The method may then end.

An embodiment of a method for forming a semiconductor device includes providing a semiconductor substrate having a top surface, a bottom surface, an active region, and an edge region, and forming a gate structure in a first trench in the active region of the semiconductor substrate, where the gate structure has a first side and a second side. The method further includes forming a termination structure in a second trench in the edge region of the semiconductor substrate. The termination structure has an active region facing side and a device perimeter facing side. The method further includes forming first and second source regions of the first conductivity type in the semiconductor substrate adjacent both the first side and the second side of the gate structure, and forming a third source region in the semiconductor substrate adjacent the active region facing side of the termination structure.

An embodiment of a method for forming a trench metal oxide semiconductor device includes providing a semiconductor substrate having a top surface, a bottom surface, an active region, and an edge region, and forming a plurality of parallel gate structures in a plurality of parallel first trenches in the active region of the semiconductor substrate. Each of the gate structures has a first side and a second side. The method further includes forming a termination structure in a second trench in the edge region of the semiconductor substrate. The termination structure has an active region facing side and a device perimeter facing side. The method further includes forming first and second source regions of the first conductivity type in the semiconductor substrate adjacent both the first sides and the second sides of the gate structures, and forming a third source region in the semiconductor substrate adjacent the active region facing side of the termination structure.

An embodiment of a semiconductor device includes a semiconductor substrate, a gate structure, a termination structure, and first, second, and third source regions. The semiconductor substrate has a top surface, a bottom surface, an active region, and an edge region. The gate structure is formed in a first trench in the active region of the semiconductor substrate, and the gate structure has a first side and a second side. The termination structure is formed in a second trench in the edge region of the semiconductor substrate, and the termination structure has an active region facing side and a device perimeter facing side. The first and second source regions are of the first conductivity type, and are formed in the semiconductor substrate adjacent both the first side and the second side of the gate structure. The third source region is formed in the semiconductor substrate adjacent the active region facing side of the termination structure.

While at least one exemplary embodiment has been presented in the foregoing detailed description, it should be appreciated that a vast number of variations exist, especially with respect to choices of device types, materials and doping. The above-described embodiments are especially useful for formation of trench metal oxide devices, but persons of skill in the art will understand based on the description here in that other types of devices can also be fabricated using the principles described herein. For example, and not intended to be limiting, a trench based vertical IGBT device can be fabricated by using a P+ substrate rather than an N+ substrate, with the other device regions as previously described in the various examples. The various embodiments are also useful for fabrication of diode, BJT, IGBT and thyristor devices as well as those described herein. It should be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A semiconductor device comprising:
   a semiconductor substrate having a top surface, a bottom surface, an active region, and an edge region;
   a gate structure in a first trench in the active region of the semiconductor substrate, wherein the gate structure has a first side and a second side, and the gate structure includes a gate electrode and a gate oxide between the gate electrode and the semiconductor substrate;
   a termination structure in a second trench in the edge region of the semiconductor substrate, wherein the termination structure has an active region facing side and a device perimeter facing side, the second trench is partially defined by a sidewall at the active region facing side of the termination structure, and the termination structure includes an edge electrode and the gate oxide between the edge electrode and the sidewall of the second trench;
   first and second source regions of a first conductivity type in the semiconductor substrate adjacent both the first side and the second side of the gate structure; and
   a third source region in the semiconductor substrate adjacent to and contacting the sidewall of the second trench at the active region facing side of the termination structure.

2. The semiconductor device of claim 1, wherein the semiconductor substrate comprises:
   a first semiconductor layer having the first conductivity type and defining the bottom surface, wherein the first semiconductor layer corresponds to a drain of the device; and
   a second semiconductor layer having the first conductivity type over the first semiconductor layer and defining the top surface, wherein the first and second trenches extend from the top surface into but not through the second semiconductor layer, and portions of the second semiconductor layer underlying the gate structure and the termination structure correspond to drift spaces of the device.

3. The semiconductor device of claim 1, further comprising:
   a gate feed structure above the top surface in the edge region in contact with the termination structure and extending over the device perimeter facing side of the termination structure toward a perimeter of the device.

4. The semiconductor device of claim 1, wherein the termination structure substantially surrounds the active region.

5. A semiconductor device comprising:
   a semiconductor substrate having a top surface, a bottom surface, an active region, and an edge region;
   a gate structure in a first trench in the active region of the semiconductor substrate, wherein the gate structure has a first side and a second side, and the gate structure includes a gate electrode and a gate oxide between the gate electrode and the semiconductor substrate;

a termination structure in a second trench in the edge region of the semiconductor substrate, wherein the termination structure has an active region facing side and a device perimeter facing side, the second trench is partially defined by a sidewall at the active region facing side of the termination structure, and the termination structure includes an edge electrode and the gate oxide between the edge electrode and the sidewall of the second trench;

first and second source regions of a first conductivity type in the semiconductor substrate adjacent both the first side and the second side of the gate structure;

a third source region in the semiconductor substrate adjacent to and contacting the sidewall of the second trench at the active region facing side of the termination structure; and a body region of a second conductivity type in the semiconductor substrate between the gate structure and the termination structure, wherein the body region extends from the first side of the gate structure to the active region facing side of the termination structure, and wherein the first and third source regions are formed in the body region.

6. The semiconductor device of claim 5, further comprising:

an enhanced body region of the second conductivity type and a higher doping density in the body region.

7. A semiconductor device comprising:

a semiconductor substrate having a top surface, a bottom surface, an active region, and an edge region;

a gate structure in a first trench in the active region of the semiconductor substrate, wherein the gate structure has a first side and a second side, and the gate structure includes a gate electrode and a gate oxide between the gate electrode and the semiconductor substrate;

a termination structure in a second trench in the edge region of the semiconductor substrate, wherein the termination structure has an active region facing side and a device perimeter facing side, the second trench is partially defined by a sidewall at the active region facing side of the termination structure, and the termination structure includes an edge electrode and the gate oxide between the edge electrode and the sidewall of the second trench;

first and second source regions of a first conductivity type in the semiconductor substrate adjacent both the first side and the second side of the gate structure;

a third source region in the semiconductor substrate adjacent to and contacting the sidewall of the second trench at the active region facing side of the termination structure;

at least one additional gate structure in at least one additional trench in parallel with the first trench; and additional source regions in the semiconductor substrate adjacent both sides of the at least one additional gate structure.

8. A semiconductor device comprising:

a semiconductor substrate having a top surface, a bottom surface, an active region, and an edge region;

a gate structure in a first trench in the active region of the semiconductor substrate, wherein the gate structure has a first side and a second side, and the gate structure includes a gate electrode and a gate oxide between the gate electrode and the semiconductor substrate;

a termination structure in a second trench in the edge region of the semiconductor substrate, wherein the termination structure has an active region facing side and a device perimeter facing side, the second trench is partially defined by a sidewall at the active region facing side of the termination structure, and the termination structure includes an edge electrode and the gate oxide between the edge electrode and the sidewall of the second trench;

first and second source regions of a first conductivity type in the semiconductor substrate adjacent both the first side and the second side of the gate structure;

a third source region in the semiconductor substrate adjacent to and contacting the sidewall of the second trench at the active region facing side of the termination structure;

an extension electrode in a third trench in the edge region, wherein the extension electrode extends from the device perimeter facing side of the termination structure; and a gate feed structure above the top surface in the edge region in contact with an end of the extension electrode and extending toward a perimeter of the device.

9. The semiconductor device of claim 8, wherein the extension electrode extends from a trench segment having a zig-zag configuration that includes of a series of straight, parallel trench walls that intersect at angles.

10. The semiconductor device of claim 8, wherein the extension electrode extends from a trench segment having a zig-zag configuration that includes of a series of curved parallel trench walls that intersect smoothly at turning points.

11. The semiconductor device of claim 8, wherein the extension electrode extends at substantially a right angle from the device perimeter facing side of the second trench segment.

12. A trench metal oxide semiconductor device comprising:

a semiconductor substrate having a top surface, a bottom surface, an active region, and an edge region;

a plurality of parallel gate structures in a plurality of parallel first trenches in the active region of the semiconductor substrate, wherein each of the gate structures has a first side and a second side, and each of the gate structures includes a gate electrode and a gate oxide between the gate electrode and the semiconductor substrate;

a termination structure in a second trench in the edge region of the semiconductor substrate, wherein the termination structure has an active region facing side and a device perimeter facing side, the second trench is partially defined by a sidewall at the active region facing side of the termination structure, and the termination structure includes an edge electrode and the gate oxide between the edge electrode and the sidewall of the second trench;

first and second source regions of a first conductivity type in the semiconductor substrate adjacent both the first sides and the second sides of the gate structures; and a third source region in the semiconductor substrate adjacent to and contacting the sidewall of the second trench at the active region facing side of the termination structure.

13. The semiconductor device of claim 12, further comprising:

a gate feed structure above the top surface in the edge region in contact with the termination structure and extending over the device perimeter facing side of the termination structure toward a perimeter of the device.

14. The semiconductor device of claim 12, wherein the termination structure comprises:
the second trench in the edge region to substantially surround the active region; and
the termination structure in the second trench.

15. A trench metal oxide semiconductor device, wherein the device has a first side, a second side, a third side, and a fourth side, and the device comprises:
a semiconductor substrate having a top surface, a bottom surface, an active region, and an edge region;
a plurality of parallel gate structures in a plurality of parallel first trenches in the active region of the semiconductor substrate, wherein each of the gate structures has a first side and a second side;
a second trench in the edge region to substantially surround the active region, wherein the second trench comprises four trench segments in the edge region, wherein a first trench segment is proximate to and parallel with the first side of the device and is parallel with the gate structures, a second trench segment is proximate to and parallel with the second side of the device and is perpendicular to the first trench segment and the gate structures, a third trench segment is proximate to and parallel with the third side of the device and is parallel with the first trench segment and the gate structures and perpendicular to the second trench segment, and a fourth trench segment is proximate to and parallel with the fourth side of the device and is parallel with the second trench segment and perpendicular to the first and third trench segments and the gate structures;
a termination structure in the second trench, wherein the termination structure has an active region facing side and a device perimeter facing side;
first and second source regions of a first conductivity type in the semiconductor substrate adjacent both the first sides and the second sides of the gate structures; and
a third source region in the semiconductor substrate adjacent the active region facing side of the termination structure.

16. The semiconductor device of claim 15, further comprising:
an extension electrode in a third trench in the edge region, wherein the extension electrode extends from the device perimeter facing side of the second trench segment; and
a gate feed structure above the top surface in the edge region in contact with an end of the extension electrode and extending toward a perimeter of the device.

17. The semiconductor device of claim 16, wherein the second trench segment has a zig-zag configuration that includes of a series of straight, parallel trench walls that intersect at angles.

18. The semiconductor device of claim 16, wherein the second trench segment has a zig-zag configuration that includes of a series of curved parallel trench walls that intersect smoothly at turning points.

19. The semiconductor device of claim 16, wherein the extension electrode extends at substantially a right angle from the device perimeter facing side of the second trench segment.

20. The semiconductor device of claim 16, further comprising:
a plurality of additional extension electrodes in additional trenches in the edge region, wherein the additional extension electrodes extend from the device perimeter facing side of the second trench segment, and the gate feed structure contacts ends of the additional extension electrodes.

21. A semiconductor device, comprising:
a semiconductor substrate having a top surface, a bottom surface, an active region, and an edge region;
a gate structure in a first trench in the active region of the semiconductor substrate, wherein the gate structure has a first side and a second side;
a termination structure in a second trench in the edge region of the semiconductor substrate, wherein the termination structure has an active region facing side and a device perimeter facing side, and wherein the termination structure substantially surrounds the active region;
first and second source regions of a first conductivity type in the semiconductor substrate adjacent both the first side and the second side of the gate structure;
a third source region in the semiconductor substrate adjacent the active region facing side of the termination structure;
an extension electrode in a third trench in the edge region, wherein the extension electrode extends from the device perimeter facing side of the termination structure; and
a gate feed structure above the top surface in the edge region in contact with an end of the extension electrode and extending toward a perimeter of the device.

* * * * *